US008635766B2

United States Patent
Hanamura et al.

(10) Patent No.: US 8,635,766 B2
(45) Date of Patent: Jan. 28, 2014

(54) COMPONENT SUPPLYING APPARATUS

(75) Inventors: Naoki Hanamura, Shizuoka (JP); Manabu Ihara, Shizuoka (JP)

(73) Assignee: Yamaha Hatsudoki Kabushiki Kaisha, Shizuoka-Ken (JP)

( * ) Notice: Subject to any disclaimer, the term of this patent is extended or adjusted under 35 U.S.C. 154(b) by 0 days.

(21) Appl. No.: 13/514,581

(22) PCT Filed: Dec. 27, 2010

(86) PCT No.: PCT/JP2010/007566
§ 371 (c)(1),
(2), (4) Date: Jun. 7, 2012

(87) PCT Pub. No.: WO2011/083553
PCT Pub. Date: Jul. 14, 2011

(65) Prior Publication Data
US 2012/0266457 A1    Oct. 25, 2012

(30) Foreign Application Priority Data

Jan. 8, 2010  (JP) ................................ 2010-003176

(51) Int. Cl.
*B23P 19/00*  (2006.01)
(52) U.S. Cl.
USPC ................... 29/740; 29/741; 29/742; 29/759; 29/739
(58) Field of Classification Search
USPC ................... 29/740–743, 832–834, 840–846, 29/564.4–564.6; 414/277, 416.05
See application file for complete search history.

(56) References Cited

U.S. PATENT DOCUMENTS

| 5,620,405 | A | * | 4/1997 | Kamatani et al. | 483/1 |
|---|---|---|---|---|---|
| 5,727,311 | A | * | 3/1998 | Ida et al. | 29/832 |
| 5,839,187 | A | * | 11/1998 | Sato et al. | 29/743 |
| 6,571,465 | B1 | * | 6/2003 | Shirakawa | 29/832 |
| 6,594,887 | B1 | * | 7/2003 | Okuda et al. | 29/739 |
| 2006/0207089 | A1 | * | 9/2006 | Maenishi et al. | 29/832 |
| 2012/0266457 | A1 | * | 10/2012 | Hanamura et al. | 29/739 |

FOREIGN PATENT DOCUMENTS

| JP | 01-225397 A | 9/1989 |
|---|---|---|
| JP | 04-292322 A | 10/1992 |
| JP | 2008-124054 A | 5/2008 |
| JP | 2009-238822 A | 10/2009 |

OTHER PUBLICATIONS

International Search Report; PCT/JP2010/007566; Feb. 1, 2011.

* cited by examiner

*Primary Examiner* — Minh Trinh
(74) *Attorney, Agent, or Firm* — Studebaker & Brackett PC

(57) ABSTRACT

A component supplying apparatus which is appended to the electronic component working apparatus, for supplying electronic components to the electronic component working apparatus is provided. The component supplying apparatus includes a component storing section which stores the electronic components, and movement range regulator. The movement range regulator allows the component storing section to move between a supply position P1 which is set for supplying the electronic components and a retracted position P2 to which the component storing section is retracted for the purpose of maintenance of the electronic component working apparatus. In addition, the movement range regulator regulates the range of relative movement of the component storing section with respect to the electronic component working apparatus to a movement amount L4 that is previously established.

12 Claims, 17 Drawing Sheets

COMPONENT SUPPLYING APPARATUS

TECHNICAL FIELD

The present invention relates to a component supplying apparatus and a surface mounting apparatus, and more particularly, to a component supplying apparatus and a surface mounting apparatus comprising a component storing section which stores electronic components.

BACKGROUND ART

Conventionally, an electronic component mounting apparatus or a surface mounting apparatus is known as an electronic component working apparatus. For example, Patent Document 1 discloses an electronic component mounting apparatus, and a component supplying apparatus which is disposed in a prescribed position to the rear side of the electronic component mounting apparatus, for supplying electronic components to the electronic component mounting apparatus.

This component supplying apparatus is provided with an elevator section including a magazine section which stores a pallet on which electronic components are arranged, and a cart section including a pallet introduction mechanism which conveys a pallet stored in the magazine section to a prescribed position (pick-up section) on the electronic component mounting apparatus. This elevator section and cart section are configured to be mutually coupled in a fixed fashion by a coupling mechanism, and being configured to respectively move freely by means of casters, when the coupling is released. Furthermore, the respective control units of the elevator section and the cart section are interconnected by signal cables so as to perform a synchronized sequence of component supply operations. Moreover, the elevator section and the cart section are configured to be leveled horizontally in independent fashion, in order that the pallet introduction mechanism takes out and conveys a pallet from the magazine section of the elevator section, and the electronic component mounting apparatus picks up an electronic component from the pallet in the pick-up section.

PRIOR ART REFERENCES

Patent Reference

Patent Document 1: Japanese Patent Laid-open Publication No. 2009-238822

SUMMARY OF THE PRESENT INVENTION

In the case of maintenance work on the electronic component working apparatus, the component supplying apparatus is moved from a supply position to a retracted position. One object of the present invention is to provide a component supplying apparatus and a surface mounting apparatus which is capable of simplifying the movement work associated with maintenance of an electronic component working apparatus.

Means for Solving the Problems

In order to achieve the aforementioned object, the component supplying apparatus according to a first aspect of the present invention is a component supplying apparatus which is appended to an electronic component working apparatus for operating prescribed work using electronic components, for supplying electronic components to the electronic component working apparatus, comprising: a component storing section which stores the electronic components; and movement range regulating means, adapted to allow the component storing section to move between a supply position for supplying the electronic components and a retracted position to which the component storing section retracts for the purpose of maintenance of the electronic component working apparatus, for regulating a range of relative movement of the component storing section with respect to the electronic component working apparatus to a movement amount that is previously established.

Furthermore, the surface mounting apparatus according to a second aspect of the present invention comprises: a head unit which holds an electronic component and mounts the electronic component at a prescribed position on a substrate; and a component supplying apparatus which supplies the electronic component to the head unit; and the component supplying apparatus includes: a component storing section which stores the electronic components; and movement range regulating means, adapted to allow the component storing section to move between a supply position for supplying the electronic components and a retracted position to which the component storing section retracts for the purpose of maintenance of the electronic component working apparatus, for regulating a range of relative movement of the component storing section with respect to the electronic component working apparatus to a movement amount that is previously established.

Further objects, compositions and beneficial effects of the present invention will be more clearly understood from the embodiments which are described below with reference to the accompanying drawings.

BRIEF DESCRIPTION OF THE DRAWINGS

FIG. 13 is a state transition diagram for illustrating, in plan view, a movement operation of the component supplying apparatus according to the first embodiment of the present invention, wherein

BEST MODE FOR CARRYING OUT THE PRESENT INVENTION

Below, embodiments of the present invention are described with reference to the drawings.
(First Embodiment)

A first embodiment of the present invention is described below with reference to FIG. 1 to FIG. 14. The first embodiment discloses a surface mounting apparatus 100 as one example of the "electronic component working apparatus" of the present invention. The surface mounting apparatus 100 is an apparatus which mounts electronic components on a printed substrate 1 which is conveyed along a prescribed conveyance direction. The printed substrate 1 is one example of the "substrate" of the present invention. Furthermore, a component supplying apparatus 200 is employed as one example of the "component supplying apparatus" of the present invention in the surface mounting apparatus 100. The component supplying apparatus 200 is an apparatus which supplies electronic components to the surface mounting apparatus 100. In the description given below, for the sake of convenience, the direction in which the printed substrate 1 is conveyed is called a conveyance direction X, the horizontal direction perpendicular to the conveyance direction X is called a front/rear direction Y, and the up/down direction is called a vertical direction Z. Furthermore, one side of the surface mounting apparatus 100 where the component supplying apparatus 200 is disposed is supposed to be the rear side.

Figure 1:
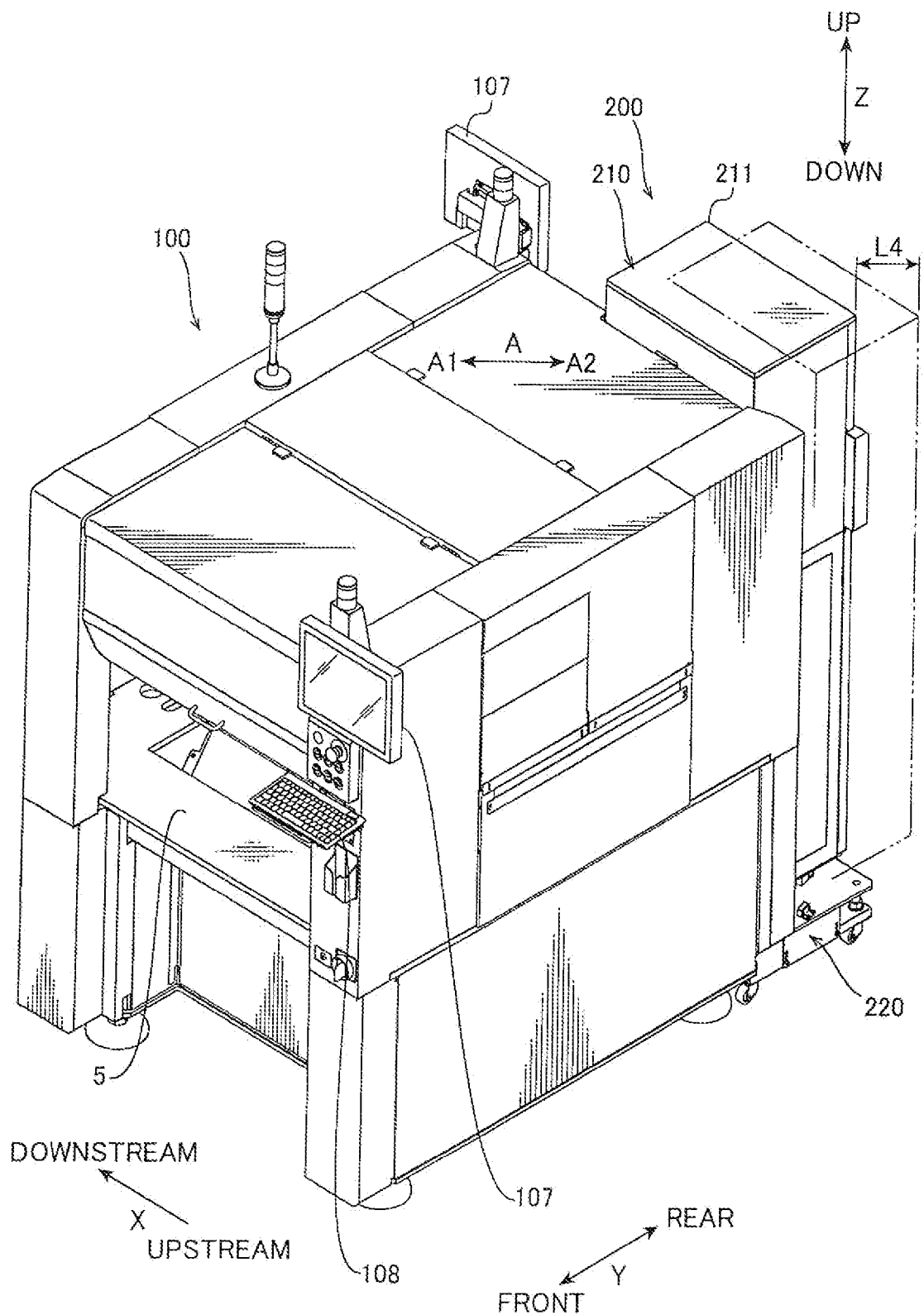
FIG. 1 is a whole perspective view showing the general composition of a surface mounting apparatus and a component supplying apparatus according to a first embodiment of the present invention.
Figure 2:
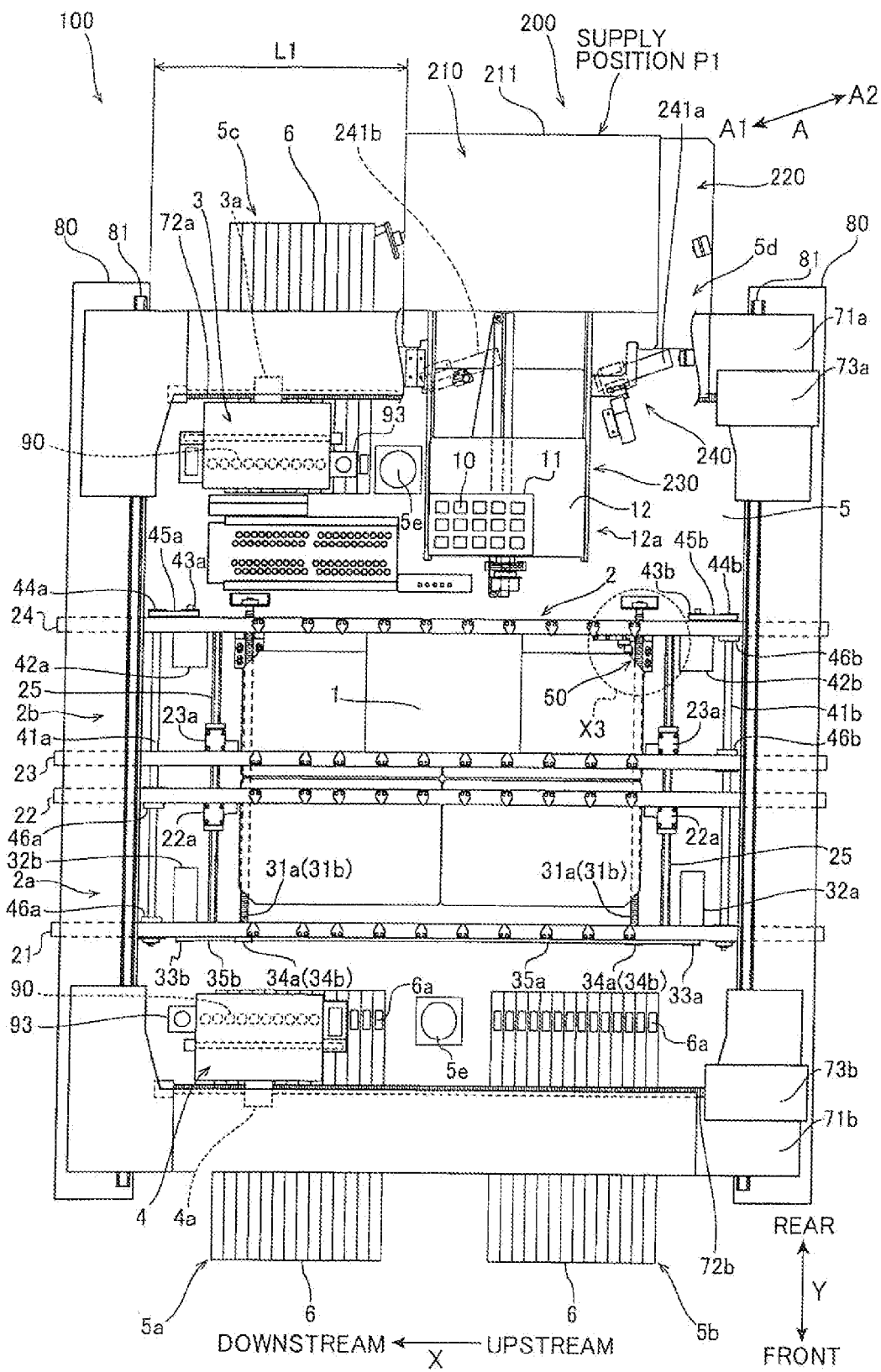
FIG. 2 is a plan diagram showing the surface mounting apparatus according to the first embodiment shown in FIG. 1.

As shown in FIG. 1, the surface mounting apparatus 100 according to the first embodiment is equipped with a base 5 which is formed in the upper part of the structure of the apparatus. The base 5 and the various elements mounted on the base 5 are covered by a housing to form an apparatus main body. As shown in FIG. 2, the surface mounting apparatus 100 is an apparatus which mounts components on a printed substrate 1. The surface mounting apparatus 100 is provided with a substrate conveyor 2 which extends in the conveyance direction X, and a pair of head units 3 and 4 which are movable in the XY directions above the substrate conveyor 2. The substrate conveyor 2, and the head unit 3 and the head unit 4 are respectively arranged above the base 5. The head unit 3 which is disposed on the rear side and the head unit 4 which is disposed on the front side are, respectively, so arranged above the substrate conveyor 2 on the base 5 to face each other. Furthermore, two set of component supply sections 5a to 5d are respectively provided at both front and rear of the base 5 so as to be positioned on either side of the substrate conveyor 2. The printed substrate 1 is one example of the "substrate" of the present invention.

Each component supply sections 5a to 5c is respectively provided with a plurality of tape feeders 6, which are so installed to align in the conveyance direction X, for supplying small electronic components. Each tape feeder 6 is configured to be able to hold a component tape (not illustrated) on which small electronic components (not illustrated) are held at a prescribed interval apart. The tape feeder 6 has a function of supplying small electronic components by feeding the component tape out to a component dispensing section 6a at the front end of the tape feeder 6.

In the component supply section 5d, there is installed a component supplying apparatus 200 for supplying large electronic components (components 10). The component supplying apparatus 200 is provided with a pallet storing section 210 which stores a plurality of pallets 12 holding trays 11 in which components 10 are arranged, and has a function of supplying components 10 by conveying a pallet 12 to a component supply position 12a. By this means, a composition is achieved in which the head unit 3 and the head unit 4 pickup components 10 on the pallet 12 which is disposed at the component supply position 12a, and mounting the components on the printed substrate 1 on the substrate conveyor 2. The component 10 is one example of the "electronic component" of the present invention. Furthermore, the pallet storing section 210 is one example of the "component storing section" of the present invention.

The substrate conveyor 2 has a function of receiving a printed substrate 1 from an upstream side of the conveyance direction X via a conveyance path (not illustrated), halting the conveyed printed substrate 1 at a prescribed mounting work position, and conveying a printed substrate 1 on which mounting work has been completed to the downstream side in the conveyance direction X.

The substrate conveyor 2 includes a first conveyor 2a and a second conveyor 2b, which are arranged in sequence from the front to rear sides with respect to the conveyance direction X. The first conveyor 2a has a first lane 21 and a second lane 22, and the second conveyor 2b has a third lane 23 and a fourth lane 24. Of the four lanes, the first lane 21, which is on the outer side, is fixed onto the base 5. Furthermore, the fourth lane 24 is installed in such a manner that the front/rear position thereof can be adjusted by the fine adjustment mechanism 50 described below. On the other hand, the second lane 22 and the third lane 23, which are on the inner side, are configured to be relatively displaceable respectively in the front/rear direction by a pair of rails 25. On both sides of the base 5 with respect to the conveyance direction X, the rails 25 are so fixed to extend in the front/rear direction. The rails 25 are so fixed on either side of the base 5 with respect to the conveyance direction X to extend in the front/rear direction. By means of this composition, the first conveyor 2a which consists of the first lane 21 and the second lane 22, and the second conveyor 2b which consists of the third lane 23 and the fourth lane 24 are composed in such a manner that the conveyor width (lane interval) can be changed independently and respectively in accordance with the width of the printed substrate 1 being conveyed, by means of the second lane 22 and the third lane 23 which are movable in the front/rear direction.

In order to drive the second and third lanes 22, 23, the substrate conveyor 2 includes a total of four ball screw shafts, namely, a pair of ball screw shafts 31a and a pair of ball screw shafts 31*b*, which are arranged in alignment in the conveyance direction X so as to extend in the front/rear direction. Furthermore, the substrate conveyor 2 includes motors 32*a* and 32*b* for driving rotation of the two sets of ball screw shafts 31*a* and 31*b*, motor shaft pulleys 33*a* and 33*b*, a pair of screw shaft pulleys 34*a* and 34*b*, and drive belts 35*a* and 35*b*. The two sets of ball screw shafts 31*a* and 31*b* are arranged in upper and lower fashion (see FIG. 4). Consequently, the pair of screw shaft pulleys 34*a* which are provided on the front sides of the upper side pair of ball screw shafts 31*a* and 31*a*, and the screw shaft pulleys 34*b* which are provided on the front sides of the lower side pair of ball screw shafts 31*b* and 31*b* are disposed in superposed positions when observed in plan view.

The upper side pair of ball screw shafts 31*a* are configured to receive transmission of drive force respectively from the drive motor 32*b*, via the motor shaft pulley 33*b*, the screw shaft pulley 34*a*, and a drive belt 35*b* which is wrapped about the motor shaft pulley 33*b* and the screw shaft pulley 34*a*. By this means, the upper side pair of ball screw shafts 31*a* are configured to be driven respectively to rotate synchronously about their axes. Furthermore, a pair of ball nuts (not illustrated) which are screwed onto the upper side pair of ball screw shafts 31*a* are fixed to the third lane 23 only, of the first lane 21 to the fourth lane 24. By this means, a composition is achieved in which the third lane 23 is moved forwards and backwards along the rails 25 by driving rotation of the upper side pair of ball screw shafts 31*a* by means of the drive motor 32*b*.

Furthermore, the lower side pair of ball screw shafts 31*b* are configured to receive transmission of drive force respectively from the drive motor 32*a*, via the motor shaft pulley 33*a*, the screw shaft pulley 34*b*, and a drive belt 35*a* which is wrapped about the motor shaft pulley 33*a* and the screw shaft pulley 34*b*. By this means, the lower side pair of ball screw shafts 31*b* are configured to be driven respectively to rotate synchronously about their axes. Furthermore, ball nuts (not illustrated) which are screwed onto the lower side pair of ball screw shafts 31*b* are fixed to the second lane 22 only, of the first lane 21 to fourth lane 24. By this means, a composition is achieved in which the second lane 22 is moved forwards and backwards along the rails 25 by driving rotation of the lower side pair of ball screw shafts 31*b* by means of the drive motor 32*a*.

Furthermore, the first conveyor 2*a* and the second conveyor 2*b* of the substrate conveyor 2 are configured to be able to convey a printed substrate 1 respectively and independently along the conveyance direction X, by driving conveyance belts (not illustrated) provided respectively therein along the first lane 21 and the second lane 22, and the third lane 23 and the fourth lane 24.

More specifically, the substrate conveyor 2 includes: spline shafts 41*a* and 41*b* which are provided respectively on the upstream side and the downstream side with respect to the conveyance direction X, extending in the front/rear direction and are supported rotatably; conveyance motors 42*a* and 42*b* which drive the respective spline shafts 41*a* and 41*b*; motor shaft pulleys 43*a* and 43*b*; spline shaft pulleys 44*a* and 44*b*; and drive belts 45*a* and 45*b*.

Spline bearings 46*a*, which are respectively coupled, slidably in the axial direction only, to the spline shaft 41*a*, are provided in the first lane 21 and the second lane 22 of the first conveyor 2*a*. A pulley (not illustrated) is coupled to each spline bearing 46*a*. A conveyance belt (not illustrated) is wrapped about the pulley. Furthermore, the spline shaft 41*a* is configured to receive transmission of drive force from the conveyance motor 42*a* via the motor shaft pulley 43*a*, the spline shaft pulley 44*a*, and a drive belt 45*a* which is wrapped about the motor shaft pulley 43*a* and the spline shaft pulley 44*a*. By this means, a composition is achieved in which the conveyance belts (not illustrated) of the first lane 21 and the second lane 22 are respectively driven synchronously by causing the spline bearing 46*a* which is provided in the first lane 21 and the spline bearing 46*a* which is provided in the second lane 22 to rotate, via the spline shaft 41*a*, by means of the drive force of the conveyance motor 42*a*.

Similarly, spline bearings 46*b* which are respectively coupled, slidably in the axial direction only, to the spline shaft 41*b*, are provided in the third lane 23 and the fourth lane 24 of the second conveyor 2*b*. A pulley (not illustrated) is coupled to each spline bearing 46*b*. A conveyance belt (not illustrated) is wrapped about the pulley. Furthermore, the spline shaft 41*b* is configured to receive transmission of drive force from the conveyance motor 42*b* via the motor shaft pulley 43*b*, the spline shaft pulley 44*b* and a drive belt 45*b* which is wrapped about the motor shaft pulley 43*b* and the spline shaft pulley 44*b*. By this means, a composition is achieved in which the conveyance belts (not illustrated) of the third lane 23 and the fourth lane 24 are respectively driven synchronously by causing the spline bearing 46*b* which is provided in the third lane 23 and the spline bearing 46*b* which is provided in the fourth lane 24 to rotate, via the spline shaft 41*b*, by means of the drive force of the conveyance motor 42*b*.

Figure 3:
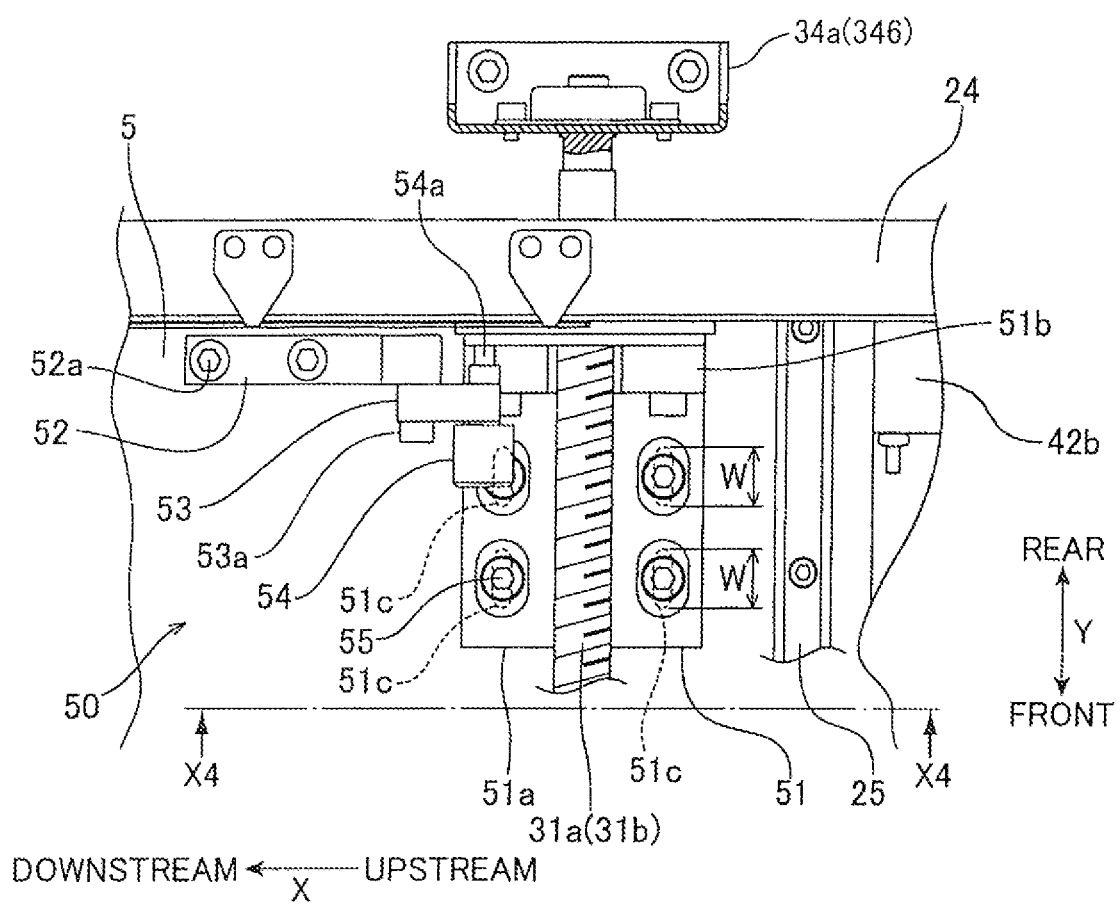
FIG. 3 is an enlarged plan diagram of a fourth lane of the surface mounting apparatus showing an enlarged view of region X3 in FIG. 2.
Figure 4:
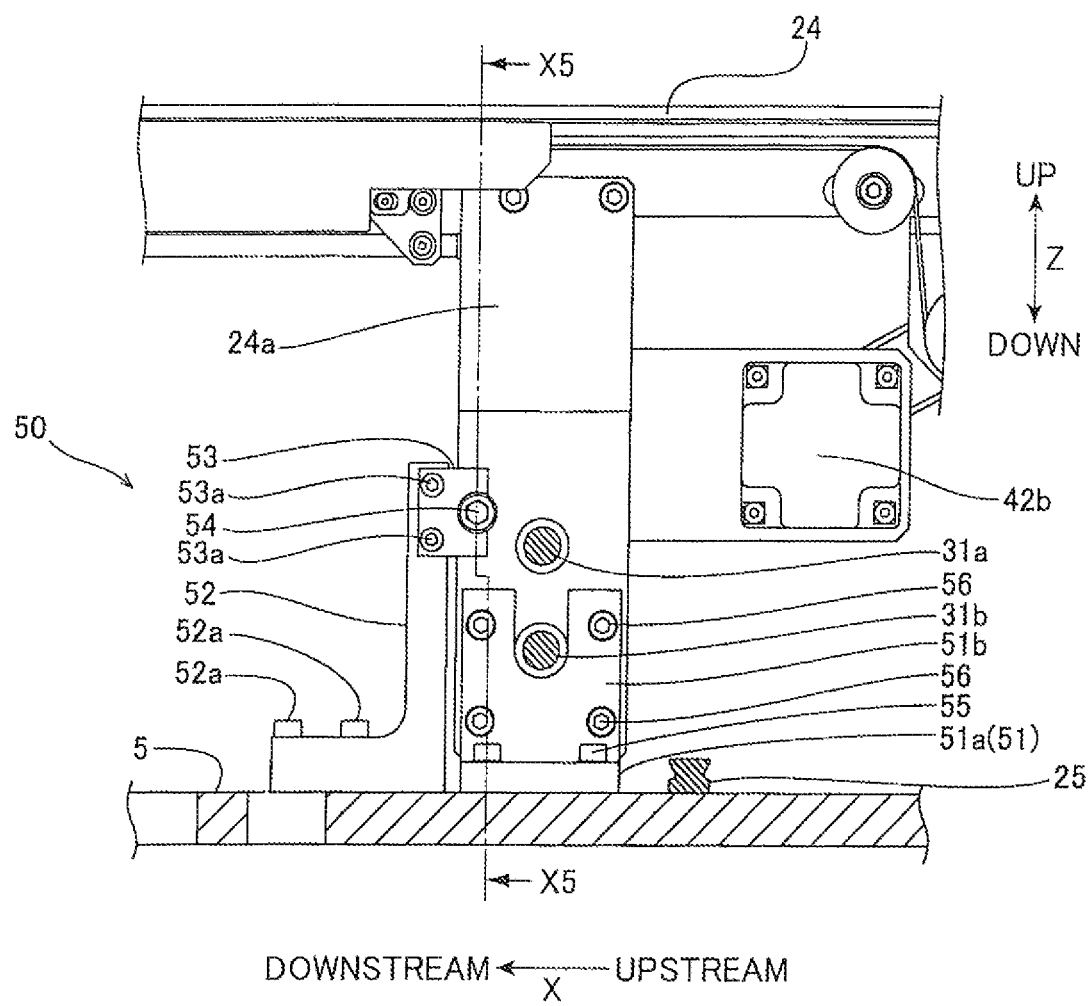
FIG. 4 is a cross-sectional diagram along X4-X4 in FIG. 3.
Figure 5:
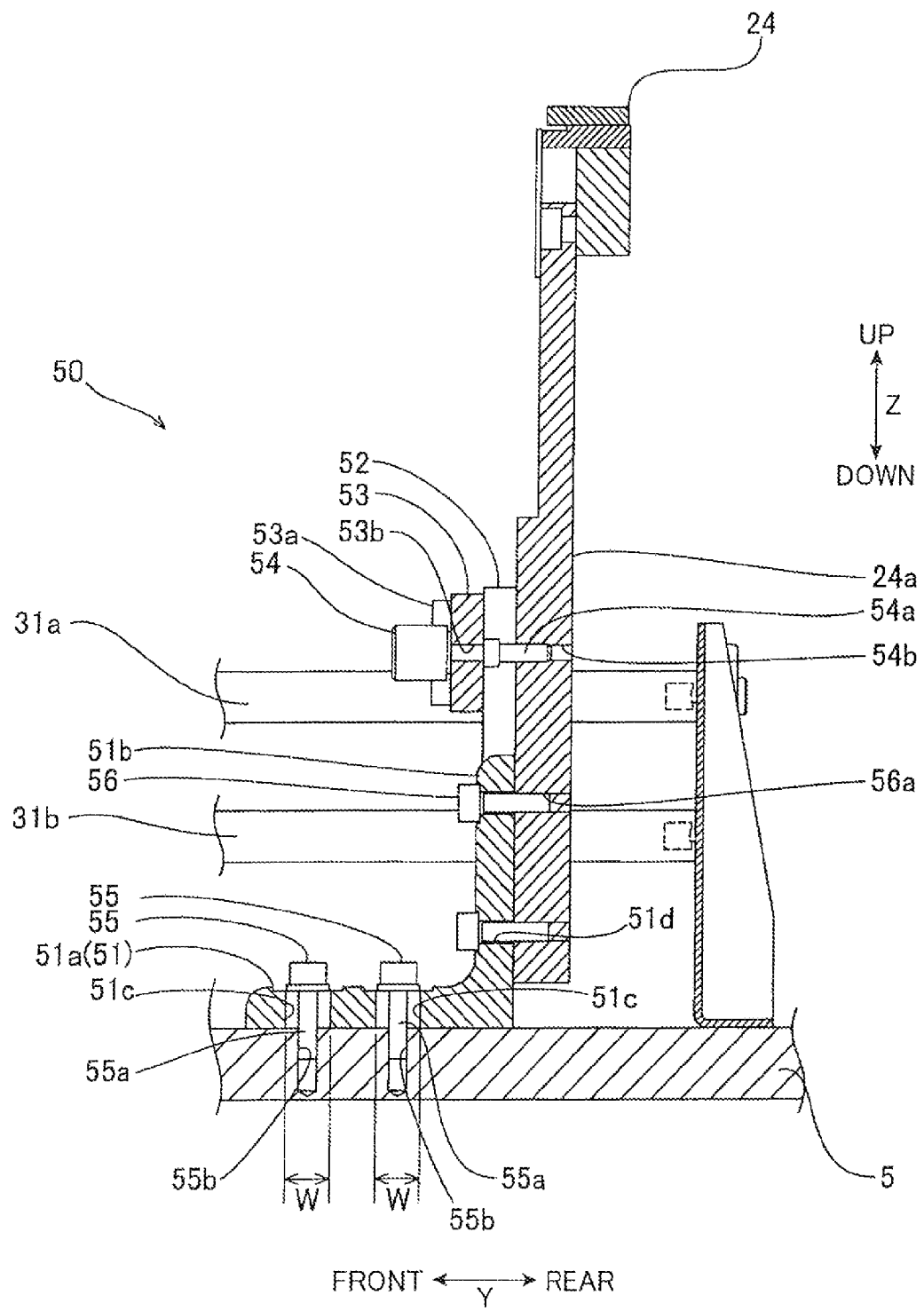
FIG. 5 is a cross-sectional diagram along X5-X5 in FIG. 4.

Here, as shown in FIG. 3 to FIG. 5, a fine adjustment mechanism 50 for finely adjusting the front/rear interval between the first lane and the fourth lane is provided in the fourth lane 24. That is, a conveyance path which connects with another apparatus forming a manufacturing line of the printed substrate 1 is provided respectively on the upstream side and the downstream side of the substrate conveyor 2, and the conveyor width of these conveyance paths may vary slightly due to assembly error, and the like. In cases such as this, the substrate conveyor 2 is composed in such a manner that the conveyor width can be adjusted finely so as to match the conveyor width of the conveyance paths on the upstream side and the downstream side, by finely adjusting the front/rear position of the fourth lane 24 using the fine adjustment mechanism 50.

The fine adjustment mechanism 50 includes a fixing member 51 which fixes a leg section 24*a* of the fourth lane 24 (see FIG. 4) and the base 5, and a holding member 52 which holds a fine adjustment screw 54 via a bracket 53.

The fixing member 51 has an L-shaped cross-sectional shape (see FIG. 5) consisting of a base side fixing section 51*a* and a leg section fixing section 51*b*. As shown in FIG. 3, four elongated holes 51*c* having a long thin shape extending in the front/rear direction are provided in the base side fixing section 51*a*. The elongated holes 51*c* have a width W in the front/rear direction and are composed in such a manner that screw shafts 55*a* of screw members 55 can be inserted respectively into same without screwed engagement in the holes. By screwing onto the screw shafts 55*a* of the screw members 55 that have passed through the elongated holes 51*c*, with thread holes 55*b* provided in the base 5, the base side fixing section 51*a* is fastened by the screw members 55 and the base 5. Consequently, as shown in FIG. 5, a gap corresponding to the width W of the elongated holes 51*c* (the difference between the width W and the axial diameter of the screw shafts 55*a*) exists to the front and rear of the screw shafts 55*a*, when the base side fixing section 51*a* is fixed by the screw members 55.

As shown in FIG. 5, round holes 51*d* into which the screw shafts of screw members 56 are respectively inserted are provided in the four corners (see FIG. 4) of the leg section fixing section 51*b*. The leg section fixing section 51*b* is configured to fix the leg section 24*a* by screwed and fastening the screw shafts which have been passed through the round holes 51d into screw holes 56a provided in the leg section 24a. The lower end section of the leg section 24a is distanced from the upper surface of the base 5, and the leg section 24a is supported by the fixing member 51.

Furthermore, the holding member 52 has an L shape and is fixed to the base 5 by screw members 52a. A bracket 53 is installed on the upper part of the holding member 52 by screw members 53a. The bracket 53 rotatably supports an adjustment screw 54 by means of a supporting hole 53b (see FIG. 5). The adjustment screw 54 is arranged in such a manner that the screw shaft 54a of the adjustment screw 54 screwed in an adjustment hole 54b provided in the leg section 24a. As shown in FIG. 5, the bracket 53 is provided at a position bordering the front surface of the leg section 24a. The screw shaft 54a of the adjustment screw 54 held on the bracket 53 screwed in the adjustment screw hole 54b of the leg section 24a, in a state where there is a spare margin (play) between the bracket 53 and the leg section 24a.

If the four screw members 55 which fasten the base side fixing section 51a of the fixing member 51 are respectively loosened, then the base side fixing section 51a becomes movable with respect to the base 5 by an amount corresponding to the width W of the elongated holes 51c into which the four screw members 55 are respectively inserted (the difference between the width W and the axial diameter of the screw shafts 55a). Consequently, the front/rear position of the fourth lane 24 and the fixing member 51 is maintained by the adjustment screw 54 of the holding member 52 which is screwed in the adjustment screw hole 54b of the leg section 24a. The holding member 52 is fixed to the base 5, and therefore, by causing the adjustment screw to rotate in this fixed state, it is possible to move the fixing member 51 and the leg section 24a supported on the fixing member 51 in parallel in the front/rear direction by the amount of fastening (or loosening) with respect to the adjustment screw hole 54b of the leg section 24a. By means of a composition of this kind, the fine adjustment mechanism 50 is configured to be able to finely adjust the interval between the first lane 21 and the fourth lane 24, by being able to move the fourth lane 24 in parallel in the front/rear direction by an amount corresponding to the width W of the elongated holes 51c of the fixing member 51 (the difference between the width W and the axial diameter of the screw shafts 55a).

As shown in FIG. 2, the rear side head unit 3 and the front side head unit 4 each have the same composition and are arranged so as to face each other. Furthermore, the head unit 3 and the head unit 4 are configured to be movable in the conveyance direction X along head unit supporting sections 71a and 71b which extend respectively in the conveyance direction X. More specifically, as shown in FIG. 2, the head unit supporting section 71a has a ball screw shaft 72a extending in the conveyance direction X, a servo motor 73a which rotates the ball screw shaft 72a, and a guide rail (not illustrated) which extends in the conveyance direction X. Furthermore, the head unit 3 has a ball nut 3a which screwed onto the ball screw shaft 72a. Similarly, the head unit supporting section 71b has a ball screw shaft 72b extending in the conveyance direction X, a servo motor 73b which rotates the ball screw shaft 72b, and a guide rail (not illustrated) which extends in the conveyance direction X. Furthermore, the head unit 4 has a ball nut 4a which screwed onto the ball screw shaft 72b. The head unit 3 and the head unit 4 are respectively configured to move in the conveyance direction X with respect to the head unit supporting sections 71a and 71b, by means the ball screw shafts 72a and 72b being rotated respectively by servomotors 73a and 73b.

Furthermore, these head unit supporting sections 71a and 71b are configured to be respectively movable in the front/rear direction along a pair of fixed rail sections 80 which extend in the front/rear direction and are provided so as to span over the substrate conveyor 2 on the base 5. More specifically, the pair of fixed rail sections 80 each have a guide rail 81 which supports the respective end portions of the head unit supporting sections 71a and 71b, movably in the front/rear direction, and a fixed element (not illustrated) consisting of a plurality of permanent magnets which are arranged in the front/rear direction inside the fixed rail section 80. Moreover, moving elements (not illustrated) consisting of a field coil are provided in the vicinity of the fixed elements on either end of the head unit supporting sections 71a and 71b. The head unit supporting sections 71a and 71b are configured to move in the front/rear direction along the guide rails 81, by controlling the current supplied to the moving elements (field coils). By means of a composition of this kind, the head unit 3 and the head unit 4 are able to move respectively in the XY directions over the base 5.

Furthermore, ten mounting head sections 90 arranged in a column in the conveyance direction X are provided respectively in the head unit 3 and the head unit 4. A suction nozzle (not illustrated) for suctioning a component and installing a component is provided on the front end (lower end) of each mounting head section 90, so as to project in the downward direction. The suction nozzles of the respective mounting head sections 90 are able to suction and hold, at the front end of the nozzle, components supplied from the tape feeder 6, by generating a negative pressure state at the front end of the nozzle. Furthermore, the mounting head sections 90 are each provided with a raising and lowering apparatus (not illustrated) such as a servo motor, for moving the suction nozzle up and down. Moreover, each mounting head section 90 is capable of adjusting the attitude of the component held on the nozzle front end (the orientation of the component in the horizontal plane), by rotating the suction nozzle while conveying the component, by means of a nozzle rotation apparatus (not illustrated), such as a servo motor. To mount components on the printed substrate 1, the aforementioned composition makes it possible to pickup components from the component dispensing sections 6a of the tape feeders 6 which are installed in the component supply sections 5a to 5c, and to pickup components 10 on a pallet 12 held in a component supply position 12a to be obtained by means of the component supplying apparatus 200 which is disposed in the component supply section 5d, by using the head unit 3 and the head unit 4.

Moreover, as shown in FIG. 2, substrate cameras 93 are installed respectively on the side of the head unit 3, on the upstream side thereof in the conveyance direction X, and on the side of the head unit 4, on the downstream side thereof in the conveyance direction X. When mounting a component, the substrate camera 93 obtains a reference point of the mounting position of the component by capturing an image of a substrate mark (not illustrated) which is provided on the surface of the printed substrate 1.

Furthermore, as shown in FIG. 2, a component camera 5e is provided, respectively, between the two component supply sections 5a and 5b on the front side and between the two component supply sections 5c and 5d on the rear side. The component camera 5e is fixed to the base 5 and is so installed that the imaging direction faces upwardly to face the lower surface of the suction nozzle. By this means, it is possible to successively capture images, from below, of the lower surface of a component which is held by the suction nozzle of the head unit 3 (head unit 4), while the component is being suctioned by the suction nozzle of the head unit 3 (head unit 4).

Next, the component supplying apparatus 200 will be described in detail.

As shown in FIG. 2, the component supplying apparatus 200 is provided with: a pallet storing section 210 which stores a plurality of pallets 12; a base section 220 on which the pallet storing section 210 is mounted; a drawer mechanism 230 for moving the pallet 12 to the component supply position 12a; and a main body side regulating section 240 (see FIG. 12) and a base side regulating section 250 (see FIG. 11) for regulating the relative movement of the pallet storing section 210 with respect to the surface mounting apparatus 100 to a prescribed range in a prescribed direction. The main body side regulating section 240 and the base side regulating section 250 are examples of "movement range regulating means" in the first embodiment. The pallet storing section 210 moves relatively with respect to the surface mounting apparatus 100 between the supply position P1 shown in FIG. 13A and the retracted position P2 shown in FIG. 13B. The supply position P1 is a position where the pallet storing section 210 performs component supply to the surface mounting apparatus 100. Furthermore, the retracted position P2 is a position for guaranteeing a working space for maintenance of the surface mounting apparatus 100. In the first embodiment, the pallet storing section 210 is disposed in an oblique direction (inclined by approximately 18 degrees with respect to the conveyance direction X) when observed in plan view. In the description given below, the linear movement direction from the retracted position P2 to the supply position P1 is called "return direction A1" and the linear movement direction from the supply position P1 to the retracted position P2 is called the "retracting direction A2". Furthermore, if it is not particularly necessary to specify the start point and the end point, then the retracting direction A2 or the return direction A1 may also be called "direction A".

The relative movement of the pallet storing section 210 is actually performed by the main body side regulating section 240 and the base side regulating section 250. The main body side regulating section 240 couples the pallet storing section 210 to the surface mounting apparatus 100 in a reciprocally movable fashion between the supply position P1 and the retracted position P2. The base side regulating section 250 couples the pallet storing section 210 to the base section 220 on which the pallet storing section 210 is mounted, in a relatively movable fashion. The base section 220 is one example of a "base member" of the present invention. Furthermore, the linear guide rails 241a and 241b are one example of a "guide member" of the present invention.

Figure 6:
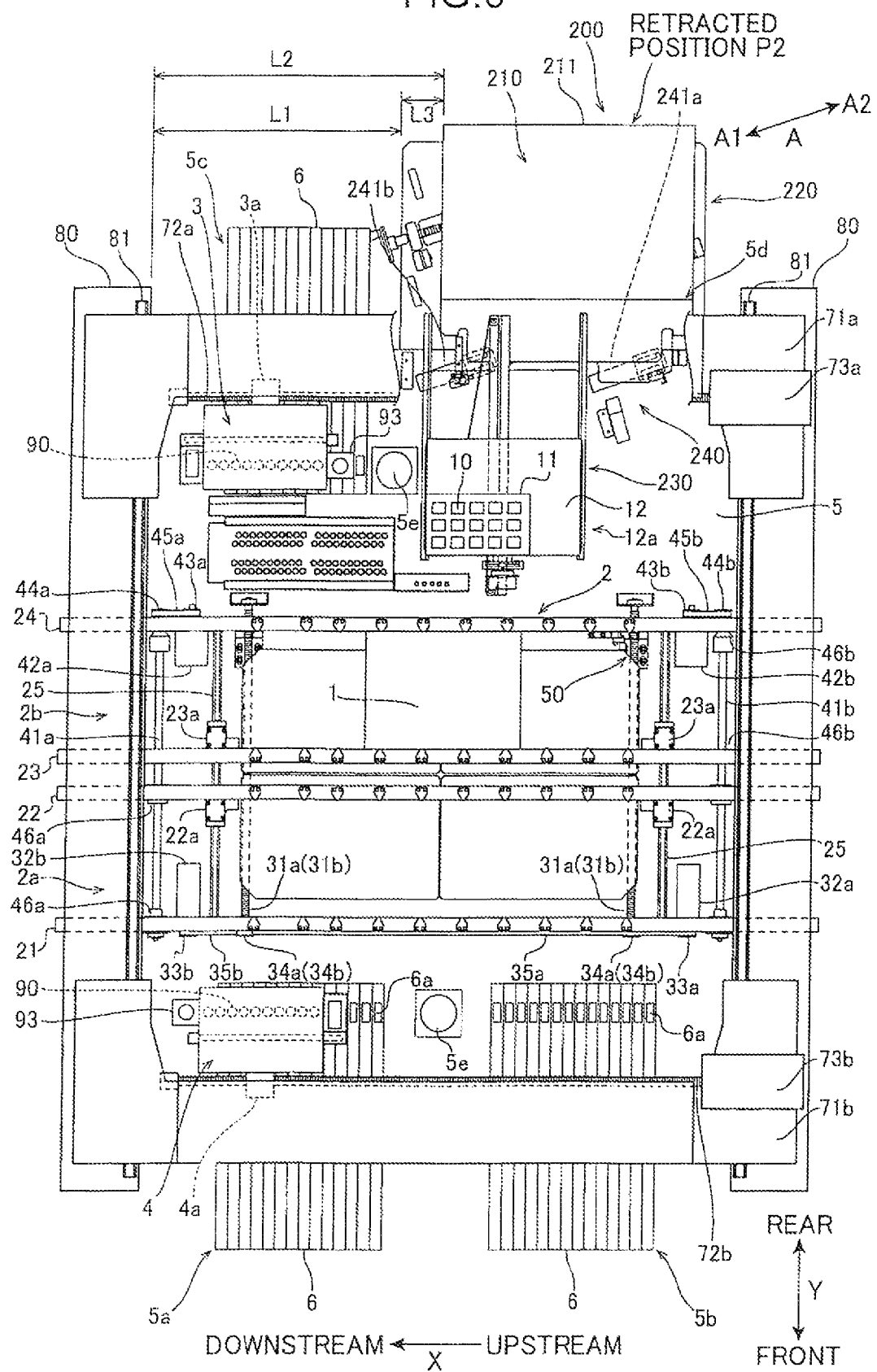
FIG. 6 is a plan diagram showing a case where a pallet storing section of the surface mounting apparatus shown in FIG. 2 is situated in a retracted position.

In this first embodiment, when the pallet storing section 210 is moved from the supply position P1 to the retracted position P2, the pallet storing section 210 is moved in a direction which enlarges the working space for maintenance work on the surface mounting apparatus 100. As shown in FIG. 2, when the pallet storing section 210 is disposed in the supply position P1, the distance along the conveyance direction X of the space which is opened on the rear side (the component supplying apparatus 200 side) of the surface mounting apparatus 100 is the distance L1. On the other hand, as shown in FIG. 6, when the pallet storing section 210 is retracted to the retracted position P2, the rear side (component supplying apparatus 200 side) of the surface mounting apparatus 100 is enlarged by a space of distance L3. Consequently, the width in the conveyance direction X of the maintenance work space after retracting is enlarged to the distance L2, which is the distance L1 plus the distance L3.

Figure 7:
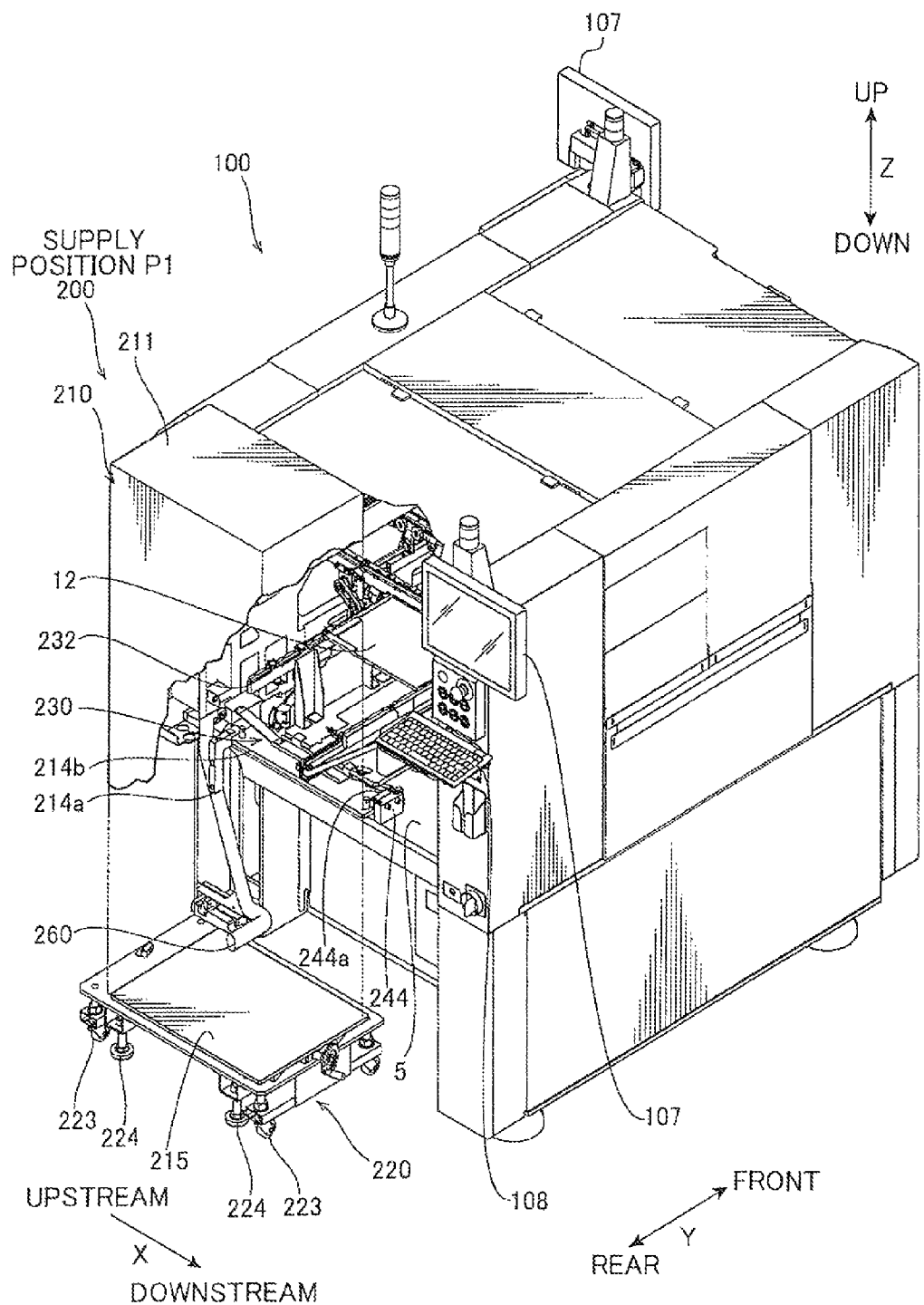
FIG. 7 is a rear side perspective diagram of a case where the pallet storing section corresponding to FIG. 2 is situated in the supply position.
Figure 8:
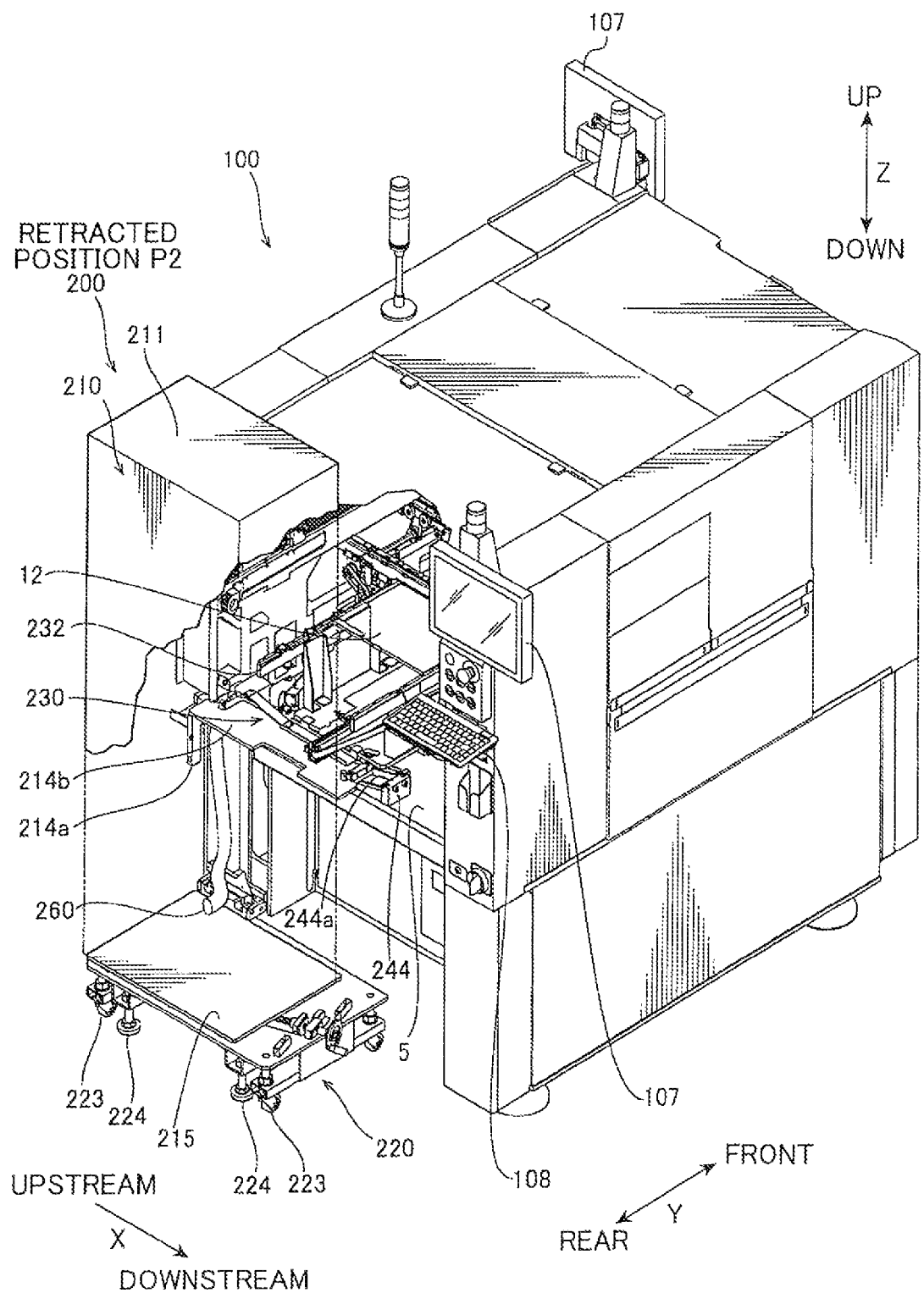
FIG. 8 is a rear side perspective diagram of a case where the pallet storing section corresponding to FIG. 6 is situated in the retracted position.

Furthermore, as shown in FIG. 7 and FIG. 8, the pallet storing section 210 is connected to the surface mounting apparatus 100 by means of a harness 260 which stores power supply cables, signal cables connected to the control apparatus 101 of the surface mounting apparatus 100, which is described below, and air supply cables for driving an air driving mechanism (not illustrated), and the like. The pallet storing section 210 is composed in such a manner that it can be moved while still connected to the harness 260, when moved between the supply position P1 (see FIG. 7) and the retracted position P2 (see FIG. 8).

Figure 9:
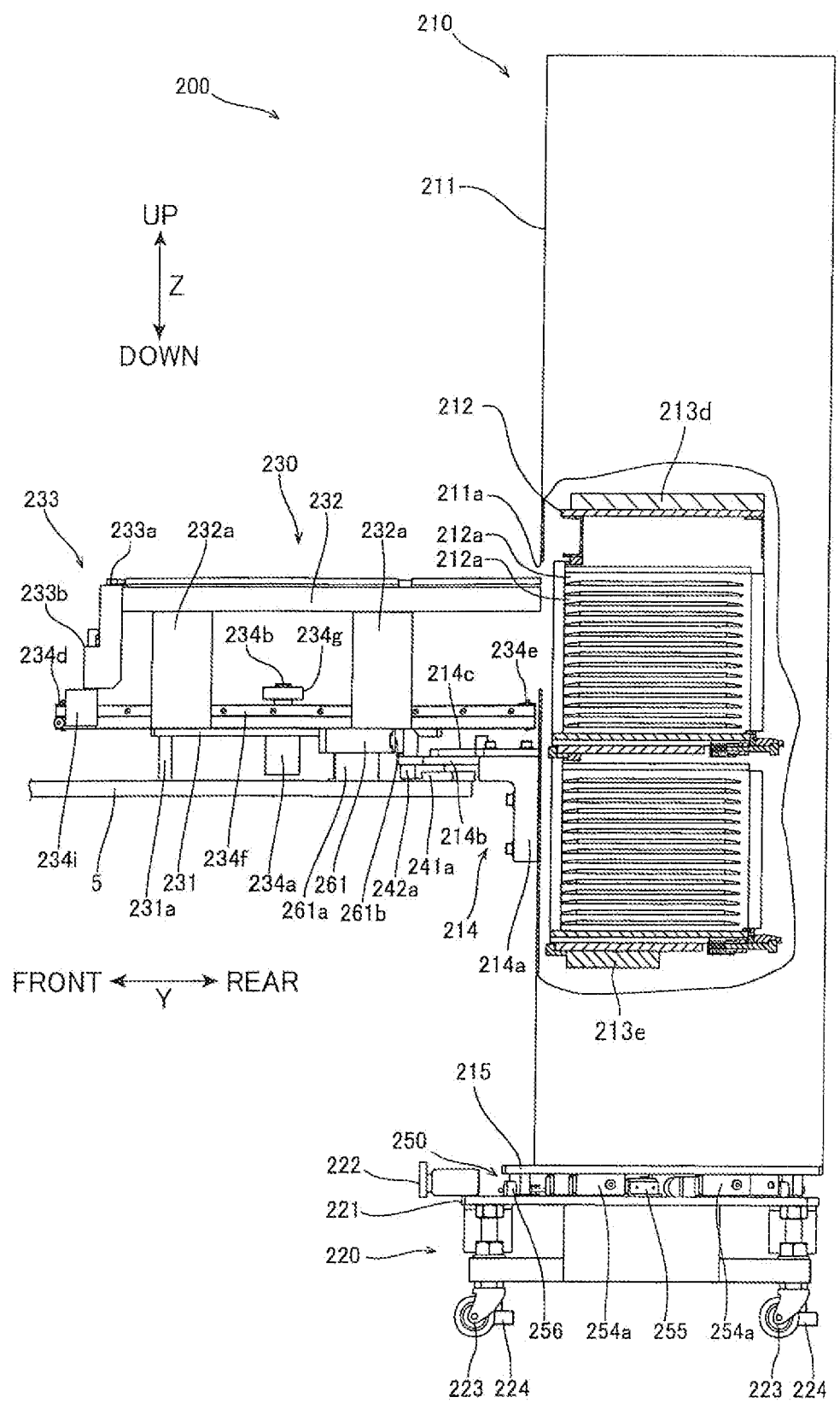
FIG. 9 is a partial cross-sectional side view for describing the component supplying apparatus according to the first embodiment of the present invention.

As shown in FIG. 9, the pallet storing section 210 includes a housing 211, an elevator mechanism which is installed in the housing 211, a coupling section 214 which is coupled to the base 5 of the surface mounting apparatus 100 by the main body side regulating section 240, and a bottom member 215 which is coupled to the base section 220 by the base side regulating section 250.

Figure 10:
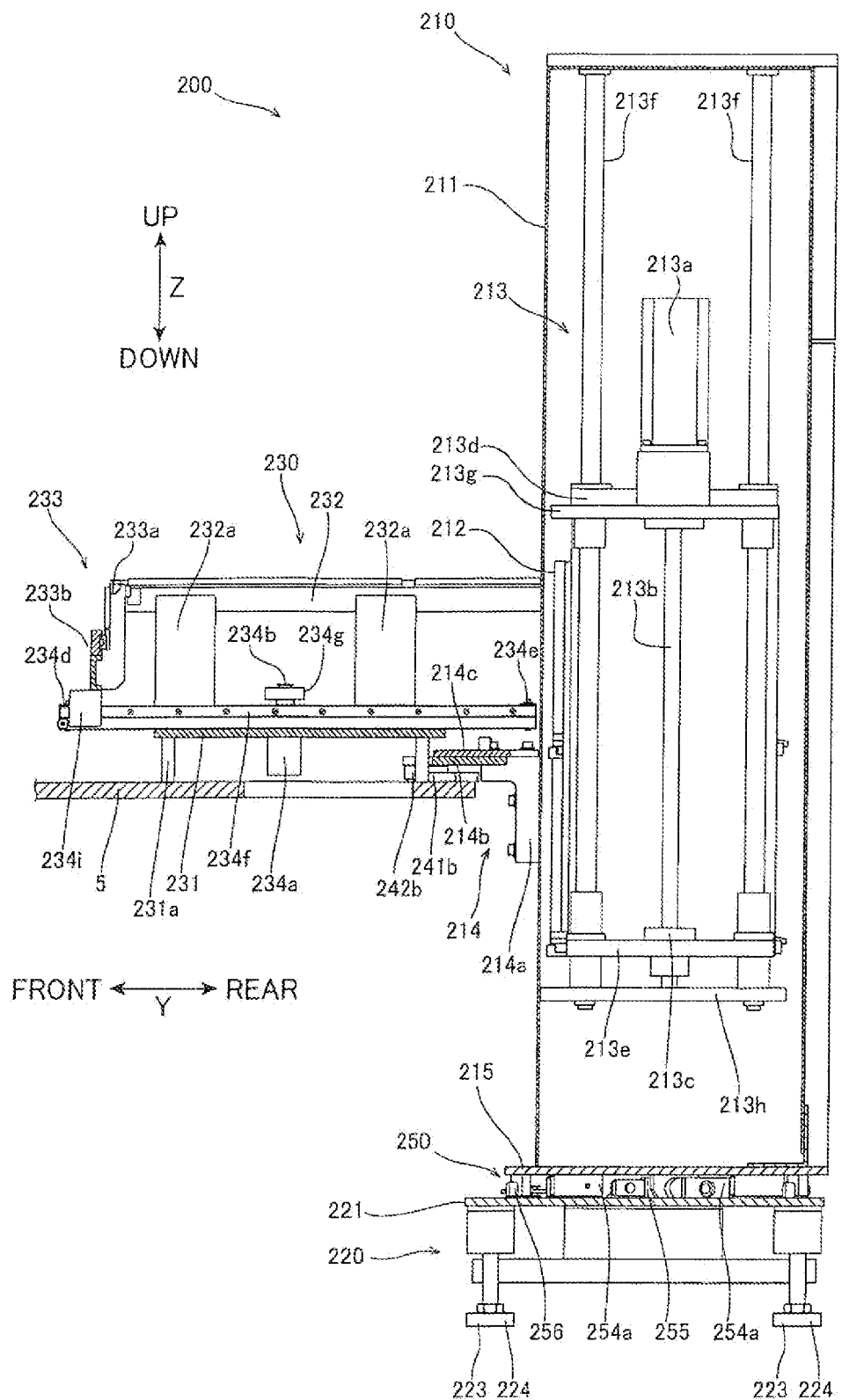
FIG. 10 is a partial cross-sectional side view for describing a raising and lowering mechanism of a component supplying apparatus according to the first embodiment of the present invention.

The elevator mechanism installed in the housing 211 includes a magazine section 212 which stores pallets 12, and an raising and lowering mechanism 213 for moving the magazine section 212 up and down (see FIG. 10). Furthermore, an opening section 211a is provided in the surface mounting apparatus 100 side of the housing 211 at a position corresponding to the drawer mechanism 230, in such a manner that a pallet 12 stored in the magazine section 212 (see FIG. 2) can be drawn out by the drawer mechanism 230.

As shown in FIG. 9, the magazine section 212 has a box-shaped structure. A plurality of slot sections 212a are arranged in the vertical direction in the magazine section 212, each slot section 212a being formed so as to extend in the horizontal direction corresponding to the pallets 12. By inserting pallets 12 on which components 10 (trays 11) are loaded respectively into the plurality of slot sections 212a, the magazine 212 holds a plurality of pallets 12 in a vertically stacked fashion.

As shown in FIG. 10, the raising and lowering mechanism 213 includes an elevator motor (LZ axis motor) 213a which is incorporated into the housing 211, a ball screw shaft 213b which is driven to rotate about the Z axis by the elevator motor 213a, a ball nut 213c which screwed onto the ball screw shaft 213b, a pair of upper and lower movable plates 213d and 213e which support the magazine section 212, a pair of guide shafts 213f which are provided respectively on the upper and lower sides of the ball screw shaft 213b, and fixing plates 213g and 213h for supporting the elevator motor 213a and the ball screw shaft 213b. The pair of guide shafts 213f are fixed to the upper part of the housing 211. The fixing plates 213g and 213h are respectively fixed and supported at prescribed positions on the pair of guide shafts 213f. The elevator motor 213a is installed on the upper side fixing plate 213g. The fixing plate 213g and the lower side fixing plate 213h rotatably support the ball screw shaft 213b.

The upper side movable plate 213d is arranged above the upper side fixed plate 213g. A pair of insertion holes (not illustrated) are formed in the movable plate 213d. The guide shafts 213f are respectively inserted into the insertion holes. The movable plate 213d is configured to be movable in the up/down direction along the pair of guide shafts 213f. Furthermore, the lower side movable plate 213e is arranged at a position above the lower side fixed plate 213h. A pair of insertion holes (not illustrated) are formed in the movable plate 213e. The guide shafts 213f are respectively inserted into the insertion holes. The movable plate 213e is configured to be movable in the up/down direction along the guide shafts 213f. Moreover, a ball nut 213c is fixed to the lower side movable plate 213e. By this means, a composition is achieved in which the movable plate 213e which has a ball nut 213c and the magazine section 212 and the movable plate 213d, are raised and lowered by driving the ball screw shaft 213b to rotate by means of the elevator motor 213a. By means of the composition of this kind, the raising and lowering mechanism 213 is able to raise and lower the magazine section 212 inside the housing 211, and to situate a desired pallet 12 which is stored in one of the slot sections 212a of the magazine section 212 at a prescribed drawing out position by the drawer mechanism 230.

As shown in FIG. 9, the coupling section 214 is provided in order to couple sliders 242a and 242b (see FIG. 12) of the main body side regulating section 240, which are described below, with the pallet storing section 210. The coupling section 214 includes an L-shaped attachment piece 214a which is fixed to the front surface of the housing 211, a base plate 214b which is attached to the upper surface side of the sliders 242a and 242b, and a coupling plate 214c for coupling the attachment piece 214a and the base plate 214b. The coupling between the L-shaped attachment piece 214a and the coupling plate 214c, and the coupling between the coupling plate 214c and the base plate 214b are made by screw fastening. Furthermore, the sliders 242a and 242b are one example of a "moving member" of the present invention.

The bottom member 215 forms a flat lower surface of the pallet storing section 210 (housing 211).

Figure 11:
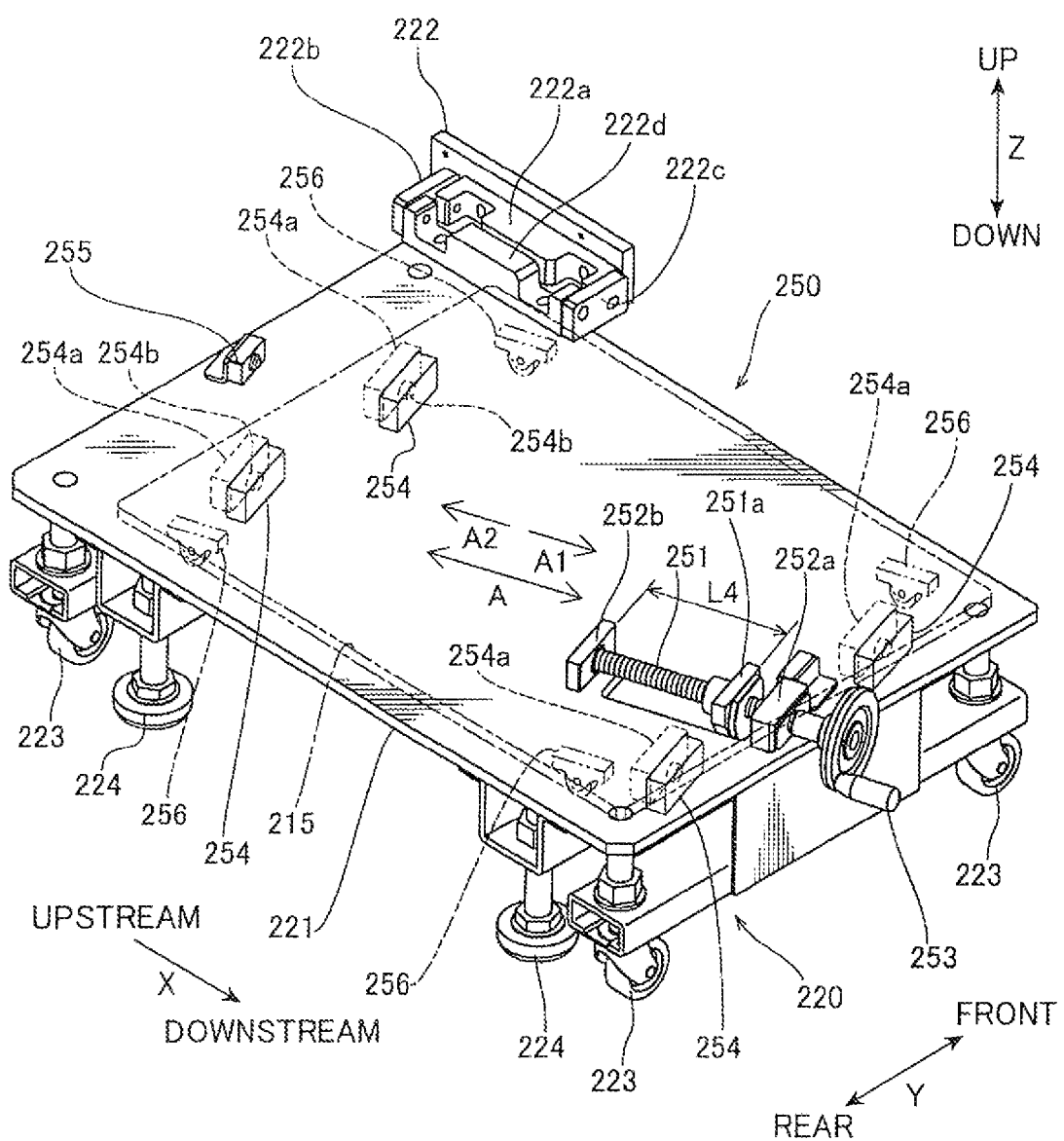
FIG. 11 is a rear side perspective diagram for describing a base section and a base side regulating section of the component supplying apparatus according to the first embodiment of the present invention.

As shown in FIG. 11, the base section 220 includes a flatly formed upper surface section 221, a fixing plate 222 for fixing the base section 220 to the base 5 of the surface mounting apparatus 100, casters 223 which are provided respectively in the four corners of the base section 220, and pillars 224.

The upper surface section 221 has a surface area which is larger than the movement amount L4 of the pallet storing section 210 when observed in plan view.

A link mechanism including four link members 222a, 222b, 222c and 222d is provided in the upper surface section 221. The link mechanism is provided in the end portion of the upper surface section 221 on the side adjacent to the surface mounting apparatus 100, and couples the fixing plate 222 to the upper surface section 221. The base section 220 is configured to be coupled to a prescribed position of the main body of the surface mounting apparatus 100 (the portion of the mechanism including the base 5), via the fixing plate 222. When the surface mounting apparatus 100 and the base section 220 are coupled together, there may be slight positional displacement, depending on the state of the surface (ground) on which the surface mounting apparatus 100 and the base section 220 are installed. In order to absorb this positional displacement, the link mechanism is configured to be coupled to the upper surface section 221 in a state which enables slight adjustment of the supply position of the fixing plate 222.

Furthermore, the casters 223 are provided respectively in the four corners of the lower surface side of the base section 220 and contact the surface of the ground (floor). The base section 220 is configured to be movable freely by means of the casters 223, before being coupled to the surface mounting apparatus 100 by means of the fixing plate 222.

The pillars 224 are provided respectively to the inner side of each of the casters 223 which are arranged in the four corners of the lower surface side of the base section 220. A height adjustment mechanism consisting of a leveling bolt is provided in each pillar 224. When installing the base section 220, it is possible to carry out horizontal leveling of the base section 220 and the pallet storing section 210 on the base section 220, by means of the pillars 224.

Figure 12:
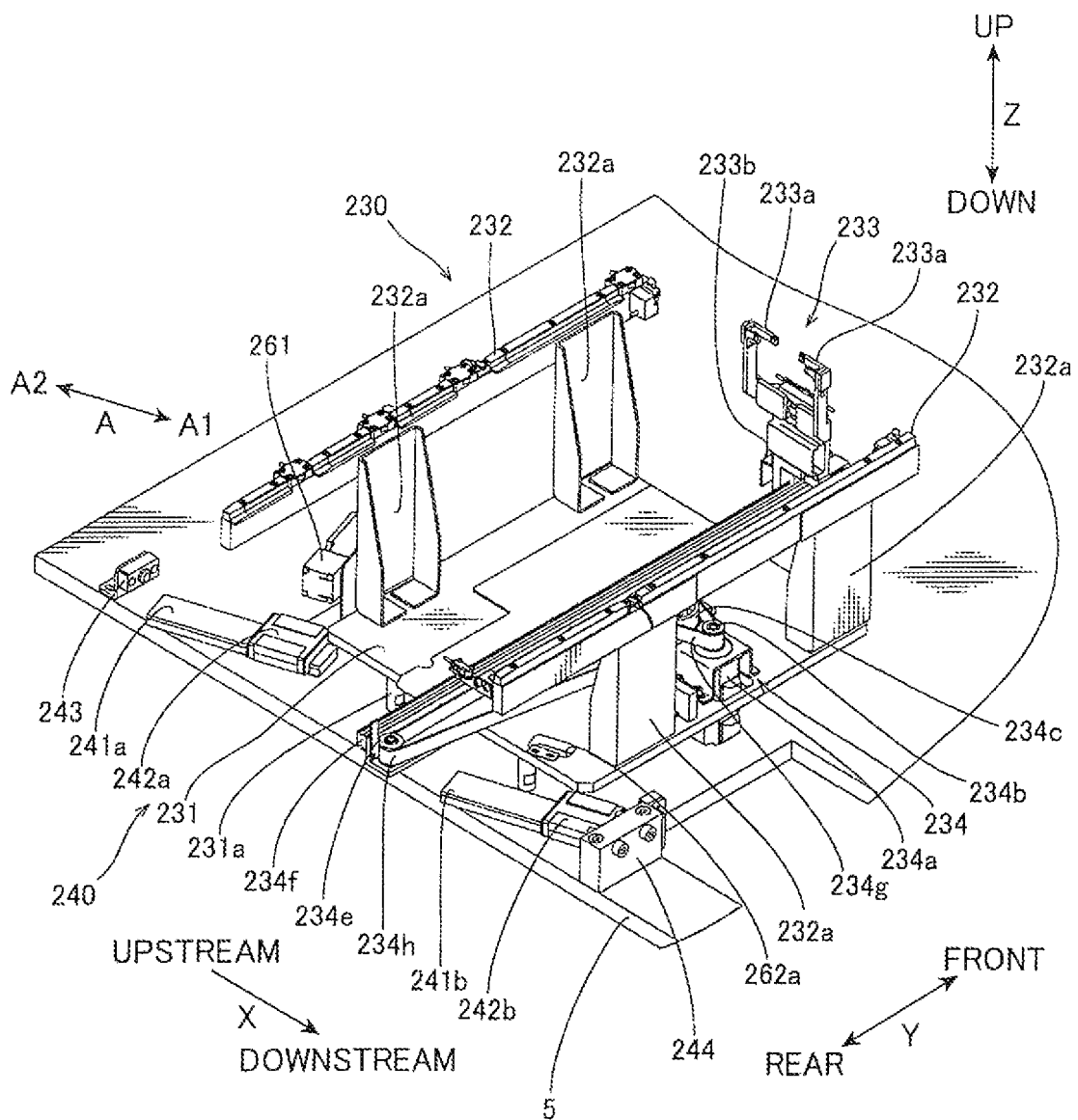
FIG. 12 is a rear side perspective diagram for describing a drawer mechanism and a main body side regulating section of the component supplying apparatus according to the first embodiment of the present invention.

As shown in FIG. 12, the drawer mechanism 230 is fixed to a prescribed position on the base 5 of the surface mounting apparatus 100 (namely, to the component supply section 5d). The drawer mechanism 230 includes a supporting platform 231, a pair of transporting rails 232 for transporting a pallet 12 forwards and backwards, a clamp mechanism 233 for drawing out a pallet 12 by engaging with a gripping section 121 on the pallet 12 (see FIGS. 13A and 13B), and a clamp movement section 234 for moving the clamp mechanism 233 forwards and backwards.

The supporting platform 231 has a supporting leg 231a (see FIG. 9) and is fixed at a prescribed position on the upper surface of the base 5. More specifically, the supporting platform 231 is so disposed to coincide with a pallet 12 in the magazine section 212 with respect to the conveyance direction X, when the pallet storing section 210 is arranged at the supply position P1 for performing component supply.

The pair of transporting rails 232 are respectively installed on the supporting platform 231 via a supporting plate 232a. Furthermore, the pair of transporting rails 232 extend in parallel in the front/rear direction on the supporting platform 231 and face in the conveyance direction X. The supporting plate 232a is configured to support the transporting rails 232 respectively at a prescribed height position corresponding to the opening section 211a (see FIG. 9) provided in the housing 211 of the pallet storing section 210. Furthermore, a pallet 12 stored in the magazine section 212 of the pallet storing section 210 is drawn out on the pair of transporting rails 232 by the clamp mechanism 233. The pallet 12 can be moved forwards and backwards in a state where the upstream side and the downstream side of the drawn out pallet 12 in the conveyance direction X are supported by the transporting rails 232.

Figure 13B:
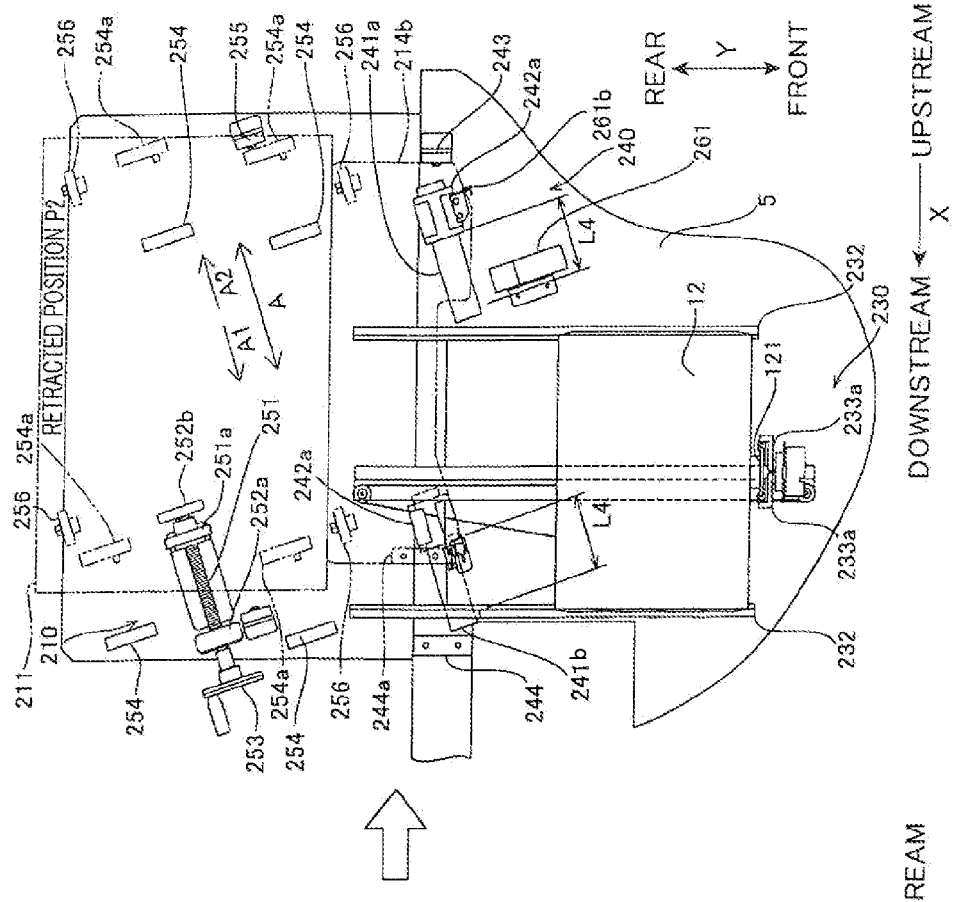
FIG. 13A shows a supply position and FIG. 13B shows a retracted position.
Figure 13A:
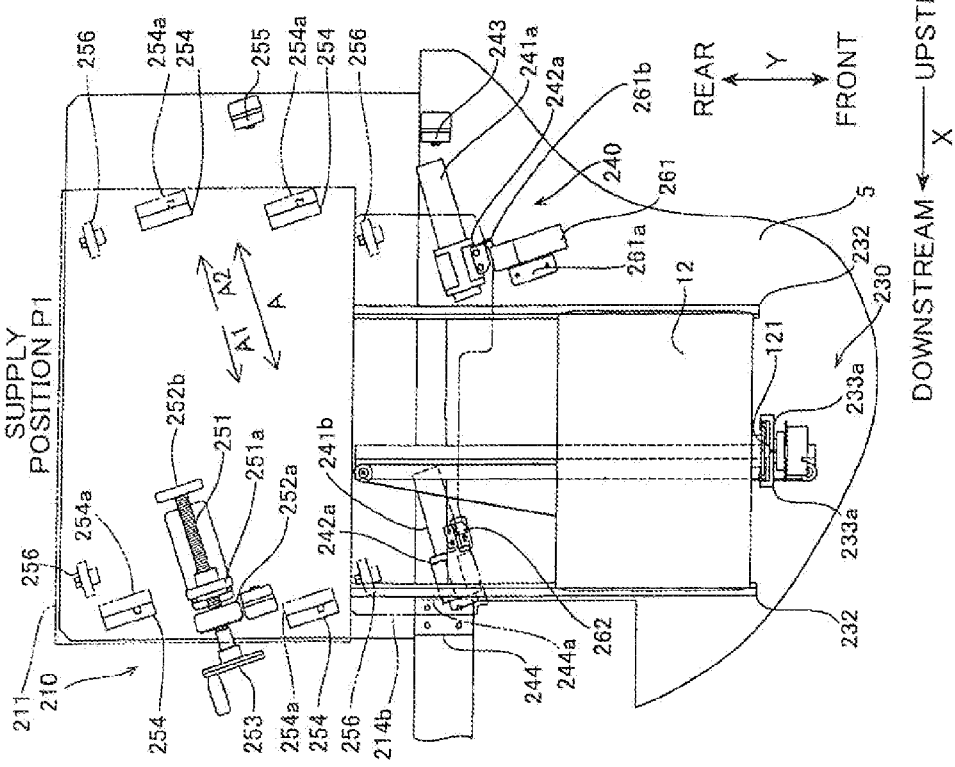

The clamp mechanism 233 has a pair of clamp sections 233a which grip the gripping section 121 of the pallet 12 (see FIGS. 13A and 13B) and a base section 233b which supports the clamp sections 223a on an upper end thereof. The clamp sections 233a are arranged at the same height position as the transporting rails 232. As shown in FIGS. 13A and 13B, the pair of clamp sections 233a respectively include engaging sections which are approximately C-shaped when observed in plan view, so as to correspond to the gripping section 121 of the pallet 12. The engaging sections are arranged so as to oppose each other in the conveyance direction X. Furthermore, the pair of clamp sections 233a are composed movably in the conveyance direction X by means of air cylinders, which are not illustrated. By this means, the clamp mechanism 233 is configured to be able to engage and disengage the gripping section 121 of the pallet 12 and the clamp sections 233a, by driving the pair of clamp sections 233a in the conveyance direction X. Furthermore, the base section 233b is supported movably on a clamp movement section 234.

As shown in FIG. 12, the clamp movement section 234 is provided on the supporting platform 231 and includes a transporting motor (LH axis motor) 234a, a drive pulley 234b which is mounted on the transporting motor 234a, idle pulleys 234c, 234d (see FIG. 9) and 234e, and a guide 234f (see FIG. 9) which is disposed in the center of the supporting platform 231 and extends in the front/rear direction. Furthermore, a belt 234g is wrapped about the drive pulley 234b of the transporting motor 234a and the idle pulley 234c. Another belt 234h is wrapped about the idle pulley 234c and the idle pulleys 234d and 234e. Furthermore, a slider 234i (see FIG. 9) is provided, which engages with the guide 234f, so as to be movable forwards and backwards along the guide 234f. This slider 234i is installed on the belt 234h. Consequently, if the belt 234h is moved by driving the transporting motor 234a, the slider 234i which is fixed to the belt 234h moves forwards and backwards along the guide 234f.

As shown in FIG. 9, a composition is adopted in which the clamp mechanism 233 is moved forwards and backwards by the clamp movement section 234, due to the clamp mechanism 233 (base section 233b) being installed on the slider 234i. The clamp movement section 234 is configured to move the clamp mechanism 233 forwards and backwards in a range between a position where the clamp mechanism 233 engages with the gripping section 121 of the pallet 12 in the magazine section 212, and a position where the pallet 12 is disposed in the component supply position 12a. By means of a composition of this kind, the drawer mechanism 230 draws out a pallet 12 from the pallet storing section 210 which is disposed in the supply position P1, and transports the pallet 12 to a component supply position 12a.

As shown in FIG. 12, the main body side regulating section 240 includes linear guide rails 241a and 241b which are fixed respectively at a prescribed position on the base 5, sliders 242a and 242b which are installed in respectively movable fashion along the linear guide rails 241a and 241b, a damper 243, and a fixing block 244.

The linear guide rails 241a and 241b respectively extend in parallel in the A direction, and are aligned in the conveyance direction X. Groove sections having a curved cross-section are formed on either side of the linear guide rails 241a and 241b. Sliders 242a and 242b having a cross-sectional shape corresponding to the groove sections are linked to the linear guide rails 241a and 241b.

The sliders 242a and 242b are configured to be movable only in the A direction along the linear guide rails 241a and 241b. As shown in FIG. 9, the upper surface portions of the sliders 242a and 242b are respectively fixed to the lower surface side of the base plate 214b of the pallet storing section 210. In FIG. 12, the base plate 214b is omitted from the drawings from the purpose of the description. In this way, the pallet storing section 210 is connected to the base 5 of the surface mounting apparatus 100 so as to be movable in the A direction only, by means of the coupling section 214 (the attachment fixture 214a, the coupling plate 214c and the base plate 214b) which is installed on the housing 211, and the sliders 242a and 242b and the linear guide rails 241a and 241b. The range of reciprocal movement of the sliders 242a and 242b on the linear guide rails 241a and 241b corresponds to the amount (distance) of movement L4 of the pallet storing section 210 (see FIG. 13B).

The damper 243 is fixed to the base 5. The layout of the damper 243 is to the upstream side of the linear guide rail 241a in the conveyance direction X. When the pallet storing section 210 moves from the supply position P1 in the retracting direction A2, then as shown in FIG. 13A, the damper 243 abuts against the base plate 214b. Therefore, the damper 243 has a function of regulating the range of movement of the pallet storing section 210 in the retracting direction A2, by abutting against the pallet storing section 210 in the retracting direction A2. In FIGS. 13A and 13B, the respective members such as the pallet storing section 210, the base plate 214b, and block members 254a and roller members 256 which are provided on the bottom member 215, and the like (members provided on the pallet storing section 210 side, excluding the movement nut 251a) are indicated by double-dotted broken lines.

The fixing block 244 is also fixed to the base 5. The layout of the fixing block 244 is to the downstream side of the linear guide rail 241b in the conveyance direction X, conversely to the damper 243. When the pallet storing section 210 moves from the retracted position P2 in the return direction A1, then as shown in FIG. 13A, the fixing block 244 abuts against the base plate 214b. Therefore, the fixing block 244 has a function of regulating the range of movement of the pallet storing section 210 in the return direction A1, by abutting against the pallet storing section 210 in the return direction A1. Furthermore, a block member 244a is fixed to the downstream side end of the base plate 214b in the conveyance direction X. The fixing block 244 and the block member 244a abut against each other when the pallet storing section 210 is disposed in the supply position P1. The block member 244a is composed in such a manner that it can be screwed onto the fixing block 244 when abutted against the fixing block 244.

Referring to FIG. 9 and FIGS. 13A and 13B, a confirmation switch 261 is provided in the vicinity of the linear guide rail 241a and the slider 242a on the upstream side in the conveyance direction X. The confirmation switch 261 is fixed at a prescribed position above the base 5 via a bracket 261a. On the other hand, a projecting member 261b is provided on the base plate 214b of the slider 242a on the upstream side in the conveyance direction X. As shown in FIG. 13A, when the pallet storing section 210 is situated in the supply position P1, the projecting member 261b on the base plate 214b abuts against the switch section of the confirmation switch 261, thereby turning on the confirmation switch 261. When the pallet storing section 210 moves from the supply position P1 in the retracting direction A1, the projecting section 261b is separated from the switch section of the confirmation switch 261 and the confirmation switch 261 turns off. When the confirmation switch 261 is turned off, the signals to the various motors provided in the surface mounting apparatus 100 and the component supplying apparatus 200 are turned off, so that accidental operation during maintenance work is prevented.

Referring to FIG. 9 and FIGS. 13A and 13B, a position confirmation sensor 262 which detects that the pallet storing section 210 is situated in the supply position P1 is provided in the vicinity of the linear guide rail 241b and the slider 242b on the downstream side in the conveyance direction X. The position confirmation sensor 262 is constituted by a transmissive light sensor which is constituted by a light emitting unit and a light reception unit (not illustrated) which are mutually opposing at a prescribed interval apart. The position confirmation sensor 262 is fixed to the base 5 by means of a bracket. A hole section 262a (see FIG. 12) bordering the light emission unit and the light reception unit of the fixed position confirmation sensor 262 is formed at a prescribed position on the supporting platform 231. The position confirmation sensor 262 is situated so as to project to the side of the base 5 from inside the hole section 262a. On the other hand, a light shielding plate (not illustrated) is situated so as to extend in the A direction at a position between the light emission unit and the light reception unit, on the upper surface of the base plate 214b. The light shielding plate is provided so as to be able to transmit light only when the pallet storing section 210 is situated in the supply position P1. By this means, the light emitted from the light emission unit is received by the light reception unit when the pallet storing section 210 is situated in the supply position P1, and therefore the position confirmation sensor 262 is able to detect that the pallet storing section 210 is situated in the supply position P1.

As shown in FIG. 9, the base side regulating section 250 is provided between the bottom member 215 of the pallet storing section 210 and the upper surface section 221 of the base section 220. As shown in FIG. 11, the base side regulating section 250 includes a trapezoidal thread 251 and thread bearings 252a and 252b, which are provided on the upper surface section 221 of the base section 220, a handle 253, four fixing blocks 254, and a damper 255. The trapezoidal thread 251 is one example of a "screw shaft" according to the present invention. Furthermore, the base side regulating section 250 includes a movement nut 251a, four block members 254a, and four roller members 256, which are provided on the lower surface of the bottom member 215. The movement nut 251a is one example of a "female screw member" of the present invention. Furthermore, the roller member 256 is one example of a "moving vehicle" of the present invention. In FIG. 11, the bottom member 215, the block members 254a and the roller members 256 are depicted by double-dotted lines.

The trapezoidal thread 251 is disposed with the axial direction thereof in the A direction on the upper surface section 221, and is supported rotatably about the axis by the thread bearings 252a and 252b. Furthermore, a handle 253 is installed on the end of the trapezoidal thread 251 on the side of the return direction A1, in such a manner that the trapezoidal thread 251 can be rotated using this handle 253. Furthermore, the movement nut 251a screws onto the trapezoidal thread 251, and being fixed to the lower surface of the bottom member 215 of the pallet storing section 210. By this means, as shown in FIGS. 13A and 13B, the movement nut 251a is moved in the A direction by relatively rotating the trapezoidal thread 251 with respect to the movement nut 251a, as a result of which the pallet storing section 210 is moved in the A direction. The movable range of the movement nut 251a on the trapezoidal thread 251 corresponds to the movement amount L4 of the pallet storing section 210.

Furthermore, as shown in FIG. 11, the four fixing blocks 254 are provided respectively at prescribed positions on the upper surface section 221 of the base section 220. Moreover, the four block members 254a on the lower surface of the bottom member 215 are arranged so as to respectively oppose the four fixing blocks 254 in the return direction A1. As shown in FIG. 13A, the fixing blocks 254 and the block members 254a are composed in such a manner that their respective mutually opposing side faces abut against each other when the pallet storing section 210 is situated in the supply position P1, and in this state, the fixing blocks 254 and the block members 254a can be screw fastened together. Furthermore, as shown in FIG. 11, a pin 254b is provided on the return direction A1 side of each block member 254a, and a hole (not illustrated) is provided in a corresponding position in each fixing block 254. When the pallet storing section 210 is situated in the supply position P1, the pin 254b fits into the hole, thereby enabling accurate positional registration. Since the block members 254a move with the movement of the pallet storing section 210 on the lower surface side of the bottom member 215, then when the pallet storing section 210 is situated in the retracted position P2, the fixing blocks 254 and the block members 254a are separated from each other by the movement amount L4 of the pallet storing section 210.

Furthermore, the damper 255 is fixed near to the upstream side end of the upper surface section 221 in the conveyance direction X. As shown in FIG. 13B, the damper 255 is configured to abut against one block member 254a (the front side block member 254a situated on the upstream side in the conveyance direction X) when the pallet storing section 210 is situated in the retracted position P2. By this means, the damper 255 has a function of elastically halting the pallet storing section 210 so as not to move beyond the retracted position P2 in the retracting direction A2.

Furthermore, as shown in FIG. 11, the four roller members 256 provided on the lower surface side of the bottom member 215 are respectively constituted by cam followers having wheels which turn in the direction of arrow A. The wheels of the roller members 256 are installed so as to be movable in the direction of arrow A while rolling in contact with the upper surface section 221 of the base section 220. Therefore, the roller members 256 have a function of reducing the frictional resistance between the pallet storing section 210 and the base section 220, and enabling the pallet storing section 210 to move smoothly over the upper surface section 221 of the base section 220.

Figure 14:
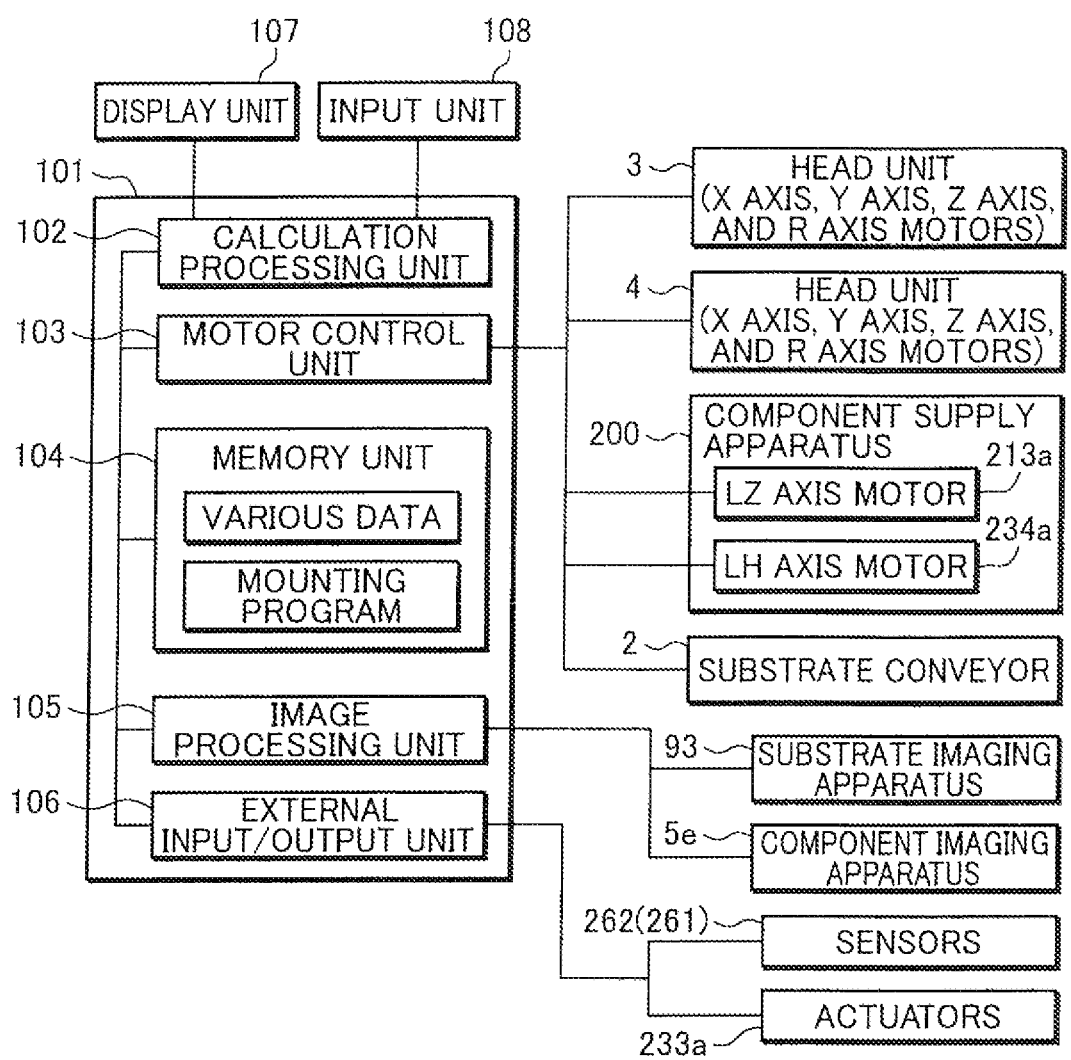
FIG. 14 is a block diagram showing the control composition of the surface mounting apparatus and the component supplying apparatus according to the first embodiment of the present invention.

The operation of the surface mounting apparatus 100 and the component supplying apparatus 200 is controlled by a control apparatus 101, which is shown in FIG. 14. The control apparatus 101 includes a calculation processing unit 102, a motor control unit 103, a memory unit 104, an image processing unit 105 and an external input/output unit 106. Furthermore, the control apparatus 101 includes display units 107 (see FIG. 1), such as liquid display devices, one provided on the front side and one provided on the rear side of the surface mounting apparatus 100, and an input unit 108 (see FIG. 1), such as a keyboard.

The calculation processing unit 102 is constituted by a CPU, or the like, which executes logical calculations. The calculation processing unit 102 is configured to execute calculation processing for controlling operations of the head unit 3, the head unit 4, the substrate conveyor 2 (the first conveyor 2a and the second conveyor 2b) and the component supplying apparatus 200, via the motor control unit 103, and outputting the calculated control signals, in accordance with a mounting program stored in a ROM of the memory unit 104.

The motor control unit 103 is configured to control driving of the motors (such as the servo motors 73a and 73b (X axis motors) for moving in the conveyance direction X, the field coil (Y axis motor) for moving forwards and backwards, the servo motor (Z axis motor) of the elevator apparatus for moving the suction nozzles of the ten mounting head units 90 respectively upwards and downwards, and the servo motor (R axis motor) for causing the suction nozzles to rotate respectively in the R axis direction (a direction of rotation about the central axis of each suction nozzle)) of the respective parts of the head unit 3 and the head unit 4, on the basis of control signals output from the calculation processing unit 102. Furthermore, the motor control unit 103 is configured to control driving of the motors of the respective parts of the component supplying apparatus 200 (the elevator motor (LZ axis motor) 213a and the transporting motor (LH axis motor) 234a), or the like, on the basis of the control signals output from the calculation processing unit 102. Furthermore, the motor control unit 103 is configured to control driving of the motors of the respective parts of the substrate conveyor 2 (the drive motors 32a and 32b, and the conveyance motors 42a and 42b), or the like, on the basis of the control signals output from the calculation processing unit 102. By inputting the signals from the encoders (not illustrated) of these servo motors to the calculation processing unit 102 via the motor control unit 103, the calculation processing unit 102 executes calculations for operational control and outputs the calculated control signals.

The memory unit 104 is composed by a ROM (Read Only Memory) which stores a program for controlling the CPU, and the like, and a RAM (Random Access Memory) which temporarily stores various data during the operation of the apparatuses. Furthermore, the memory unit 104 stores a mounting program for manufacturing a prescribed mounted printed substrate 1, and various data required for executing this mounting program. Examples of the data are: the dimensions of the printed substrate 1 which is the subject of mounting, substrate data such as reference mark positions, various component data relating to the component which is the subject of mounting, data relating to the mounting positions and mounting directions, and the like.

The image processing unit 105 carries out reading of the imaging signals at a prescribed timing from the component camera 5e and the substrate camera 93, on the basis of control signals output from the calculation processing unit 102, and generates image data suited to recognizing the components and reference marks by carrying out prescribed image processing on the imaging signals thus read. By inputting this image data to the calculation processing unit 102, the calculation processing unit 102 executes calculations for correcting the mounting positions and mounting directions (or calculations for feedback control), and outputs the calculated control signals.

The external input/output unit 106 is connected to various sensors (not illustrated) which are provided in the surface mounting apparatus 100, and the position confirmation sensor 262, and the confirmation switch 261 of the component supplying apparatus 200, and the like, so as to receive signals from these elements. Furthermore, the external input/output unit 106 is configured to control the operations of the various actuators such as the air cylinders provided in the surface mounting apparatus 100 and the component supplying apparatus 200 (such as the air cylinders for moving the pair of clamp sections 233a), on the basis of control signals output from the calculation processing unit 102.

Next, the operation during maintenance of the surface mounting apparatus 100 according to the first embodiment of the present invention will be described in detail with reference to FIG. 7, FIG. 8, FIGS. 13A and 13B, and FIG. 15.

Figure 15:
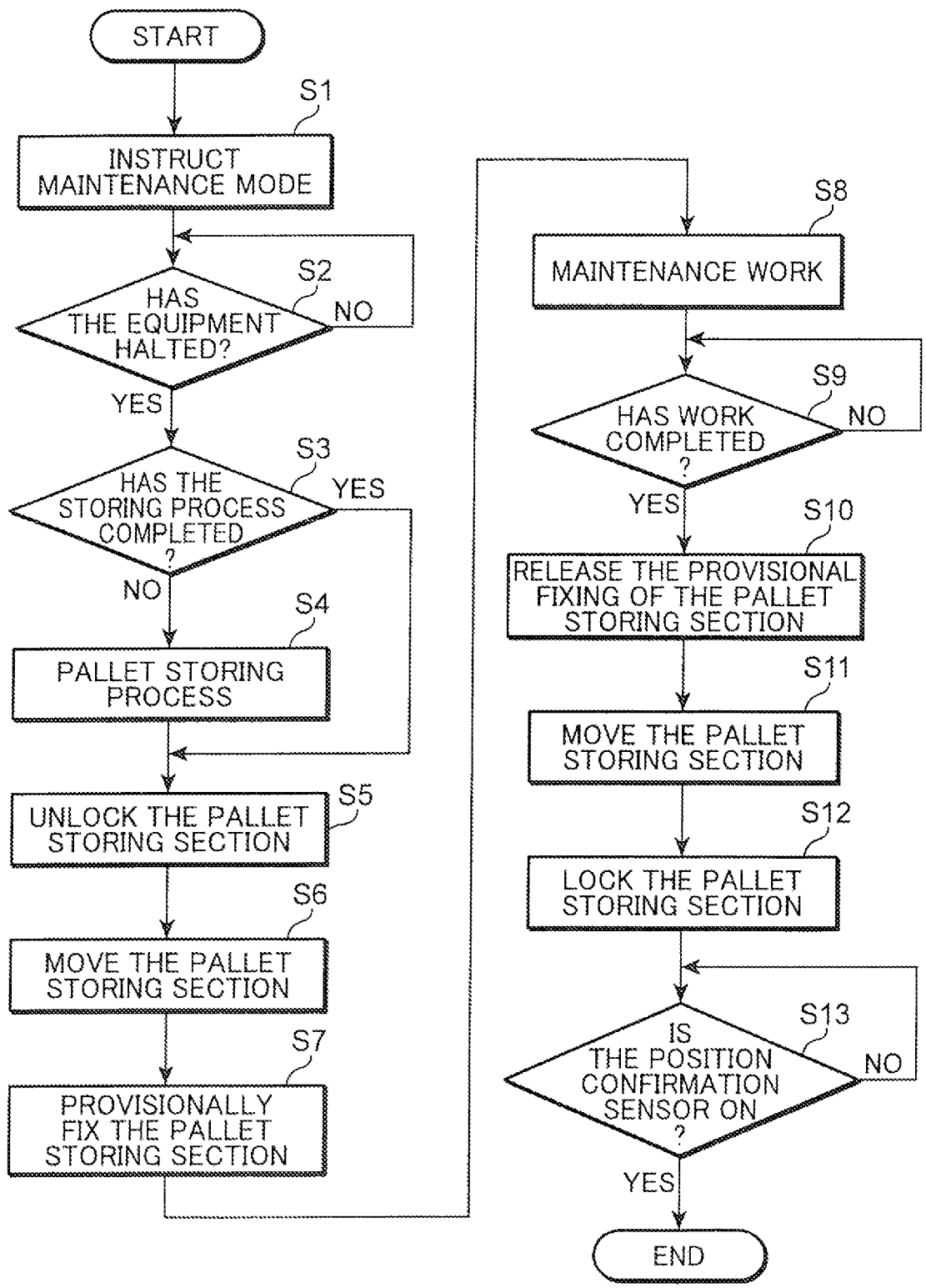
FIG. 15 is a flowchart for describing maintenance work for the surface mounting apparatus according to the first embodiment of the present invention.

As shown in FIG. 15, in step S1, an instruction to transfer to maintenance mode is input to the surface mounting apparatus 100 by an operator. More specifically, the operator issues an instruction for transfer to maintenance mode via the screen on the display unit 107, using the input unit 108. By this means, the operation of the surface mounting apparatus 100 and the component supplying apparatus 200 is halted via prescribed halt processing operations, by the calculation processing unit 102.

In step S2, the operator confirms the halting of the equipment, on the screen of the display unit 107 and from the operational status of the surface mounting apparatus 100 (component supplying apparatus 200), and waits until the equipment has halted. When the halting of the equipment has been confirmed, the procedure advances to step S3, and the operator confirms that the pallet storage process has ended. Supposing that a pallet 12 is in a drawn out state on the drawer mechanism 230 of the component supplying apparatus 200, then the operator implements a pallet storing process in step S4. More specifically, the operator activates the drawer mechanism 230 to implement storage of the pallet 12, either by operating the input unit 108 of the surface mounting apparatus 100, or by operating a control button (not illustrated) on the component supplying apparatus 200. The operator then waits until the pallet storing process has completed. When the completion of the pallet storing process has been confirmed, the procedure advances to step S5. If it has already been confirmed in step S3 that the pallet 12 has been stored, then the pallet storing process is not necessary, and therefore the operator bypasses step S4 and goes directly to step S5.

In step S5, the operator unlocks the pallet storing section 210. More specifically, the operator releases the screw fastening between the block member 244a of the main body side regulating section 240 and the fixing block 244, and also releases the screw fastening between the fixing blocks 254 of the base side regulating section 250 and the block members 254a. By this means, the pallet storing section 210 becomes movable in the A direction.

Next, in step S6, the operator turns the handle 253 of the base side regulating section 250, and drives the pallet storing section 210 which is in the supply position P1 in FIG. 13A through the movement amount L4 in the retracting direction A2, so as to move the pallet storing section 210 to the retracted position P2 in FIG. 13B. With the screw conveyance of the pallet storing section 210 on the base section 220, the sliders 242a and 242b of the main body side regulating section 240 respectively move linearly in the retracting direction A2 along the linear guide rails 241a and 241b. As shown in FIG. 13B, when the pallet storing section 210 arrives at the retracted position P2, the base plate 214b of the coupling section 214 and the damper 243 of the main body side regulating section 240 abut against each other, and the block member 254a on the base side regulating section 250 and the damper 255 also abut against each other, thereby restricting the movement of the pallet storing section 210. Furthermore, with the movement of the pallet storing section 210, the detection signal of the position confirmation sensor 262 switches off and execution of the mounting program is prohibited, thereby preventing accidental operation. Moreover, the confirmation switch 261 turns off due to the movement of the pallet storing section 210, and the signals to the various motors also switch off. By this means, operation of the motors is also prevented, apart from the execution of the mounting program. The movement of the pallet storing section 210 can be performed without releasing the connection with the harness 260 (see FIG. 7 and FIG. 8) which is connected to the pallet storing section 210.

In step S7, the operator provisionally fixes the pallet storing section 210 using the screws, clamps, and the like, and thereby prevents movement of the pallet storing section 210 during work. After the work described above, in step S8, maintenance work on the surface mounting apparatus 100 is carried out.

Thereupon, in step S9, the operator checks that the maintenance work has been completed. After confirming that the work has been completed, in step S10, the operator releases the provisional fixing of the pallet storing section 210. In the first embodiment, the pallet storing section 210 is fixed by screwing the movement nut 251a onto the trapezoidal thread 251, and therefore the provisional fixing task in step S7 and the task of releasing the provisional fixing in step S10 can be omitted.

In step S11, the operator turns the handle 253 in the opposite direction to step S6, thereby driving the pallet storing section 210, which is in the retracted position P2 in FIG. 13B, in the return direction A1 and moving same to the supply position P1 in FIG. 13A. The pallet storing section 210 is returned accurately to the supply position P1 along the same linear path of travel in direction A as step S6, by means of the sliders 242a and 242b moving respectively along the linear guide rails 241a and 241b.

As shown in FIG. 13A, when the pallet storing section 210 arrives at the supply position P1, the base plate 214b of the coupling section 214 and the fixing block 244 of the main body side regulating section 240 abut against each other, and the fixing blocks 254 on the base side regulating section 250 and the block members 254a also abut against each other, thereby restricting the movement of the pallet storing section 210 and halting the pallet storing section 210 in the supply position P1. Furthermore, when the pallet storing section 210 is halted in the supply position P1, the detection signal in the position confirmation sensor 262 switches on, and it is detected that the pallet storing section 210 is correctly disposed in the supply position P1. Moreover, due to the movement of the pallet storing section 210, the confirmation switch 261 turns on, and the various motors also become operable. Since the pallet storing section 210 is moved over the flat upper surface section 221 after horizontal leveling of the base section 220 has been carried out by means of the pillars 224, it is not necessary to carry out horizontal leveling again after this movement of the pallet storing section 210.

Next, in step S12, the operator locks the pallet storing section 210. More specifically, the operator screw fastens the block member 244a of the main body side regulating section 240 to the fixing block 244, and also screw fastens the fixing blocks 254 of the base side regulating section 250 to the block members 254a. By this means, the pallet storing section 210 is fixed to the supply position P1.

Finally, in step S13, the operator confirms on the screen of the display unit 107 that the detection signal from the position confirmation sensor 262 is on, and the task then ends. This confirmation task may also be made by checking that the confirmation switch 261 is on.

(Second Embodiment)

Next, a component supplying apparatus 300 according to a second embodiment of the present invention will be described with reference to FIG. 16 and FIG. 17. In this second embodiment, an example is described in which the range of relative movement of the pallet storing section 210 with respect to the surface mounting apparatus 100 is restricted to a movement amount (or rotation angle) θ that is previously established by a rotation regulating section 340 serving as movement range regulating means, rather than the main body side regulating section 240 and the base side regulating section 250.

Figure 16:
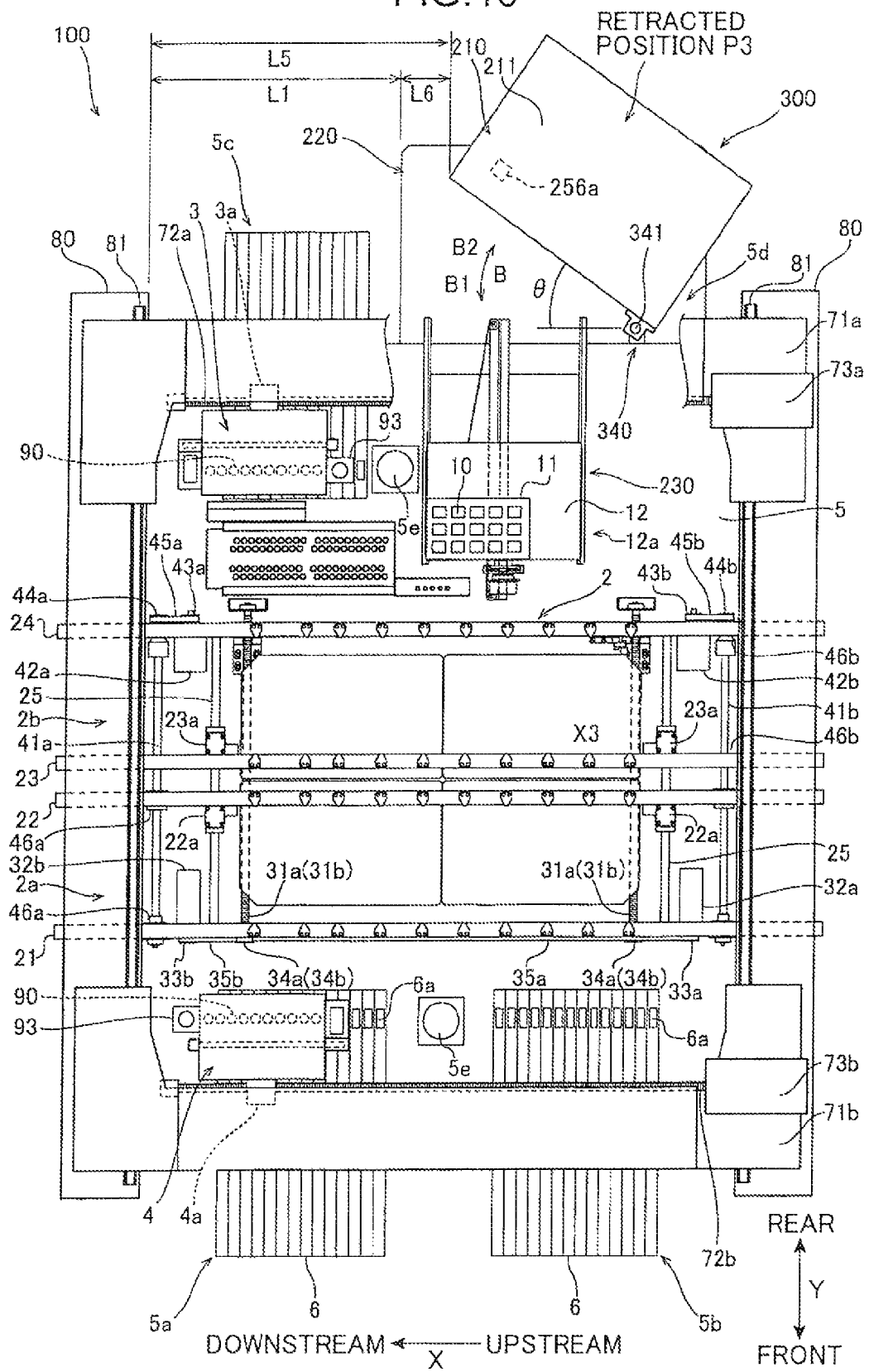
FIG. 16 is a plan diagram showing a surface mounting apparatus and a component supplying apparatus according to a second embodiment of the present invention.

As shown in FIG. 16, in the second embodiment, the component supplying apparatus 300 includes a pallet storing section 210, a base section 220, a drawer mechanism 230, and a rotation regulating section 340. The composition of the pallet storing section 210, the base section 220 and the drawer mechanism 230 is the same as the first embodiment described above, and therefore description thereof is omitted here.

As shown in FIG. 16, the rotation regulating section 340 is provided on the rear side portion of the base 5. As shown in FIG. 17, the rotation regulating section 340 includes a rotating shaft 341 which is provided with the axis thereof extending in the vertical direction, block bearings 342 and 343 which support the rotating shaft 341 rotatably about the axis thereof, and coupling sections 344 and 345 which are provided so as to rotate in unison with the rotating shaft 341. The rotation regulating section 340 regulates the pallet storing section 210 so as to be able to rotate along a prescribed path of travel about the rotating shaft 341, through a prescribed movement amount θ only, as shown in FIG. 16.

The block bearing 342 is fixed to the side face of the base 5 at a height position where the upper surface thereof substantially coincides with the upper surface of the base 5, and serves to rotatably support the upper part of the rotating shaft 341. Furthermore, the block bearing 343 is fixed to the base 5 at a height position which is above the base section 220 and rotatably supports the lower part of the rotating shaft 341. Consequently, as shown in FIG. 16, the rotating shaft 341 is disposed at a position near the rear side end of the base 5. In the second embodiment, the rotating shaft 341 is configured to be rotatable in a range of movement of θ in the direction of arrow B, by means of the block bearings 342 and 343. In the second embodiment, a composition is adopted in which this movement amount θ is approximately 35 degrees.

The coupling section 344 is fixed to the rotating shaft 341 at a position on the upper end of the rotating shaft 341. Consequently, the coupling section 344 rotates in unison with the rotating shaft 341, at a position above the block bearing 342. The coupling section 344 has a flat connecting surface 344a and is fixed to the housing 211 of the pallet storing section 210 on this connecting surface 344a. More specifically, as shown in FIG. 16, the coupling section 344 is disposed on the front surface of the housing 211, which is the upstream side in the conveyance direction X, and is fixed to the rear end portion of the housing 211.

Furthermore, the coupling section 345 is fixed to the rotating shaft 341 at a position to the upper side of the block bearing 343. Therefore, the coupling section 345 rotates in unison with the rotating shaft 341. The coupling section 345 has a flat connecting surface 345a and is fixed to the housing 211 of the pallet storing section 210 on this connecting surface 345a. Since the coupling section 344 and the coupling section 345 are arranged in the vertical direction, they are fixed to the housing 211 in mutually overlapping positions when observed in plan view.

In this way, in the second embodiment, the pallet storing section 210 is connected in a rotatable state to the base 5, via the coupling section 344 and the coupling section 345, the rotating shaft 341, and the block bearing 342 and the block bearing 343. In the second embodiment, the range of movement (rotation) in the clockwise direction in plan view from the supply position P1 to a retracted position P3 is defined to the movement amount θ. By this means, the pallet storing section 210 can be separated from the surface mounting apparatus 100 in the direction of arrow B2 and retracted to the retracted position P3 by rotating in the clockwise direction in plan view about the rotating shaft 341, from the supply position P1 (see FIG. 13A). When the pallet storing section 210 is retracted to the retracted position P3, the rear side of the surface mounting apparatus 100 (the component supplying apparatus 200 side) is enlarged by a space corresponding to the distance L6. Consequently, the width in the conveyance direction X of the maintenance work space after retracting is enlarged to the distance L5, which is the distance L1 plus the distance L6.

On the other hand, by rotating the pallet storing section 210 in the counter-clockwise direction from the retracted position P3, the pallet storing section 210 approaches the surface mounting apparatus 100 in the direction of the arrow B1, and can be returned to the supply position P1 (see FIG. 13A).

In the description given below, the direction of rotation in the counter-clockwise direction in plan view from the retracted position P3 to the supply position P1 is called the "return direction B1", and the direction of rotation in the clockwise direction in plan view from the supply position P1 to the retracted position P3 is called the "retracting direction B2". Furthermore, if it is not particularly necessary to specify the start point and the end point, then the retracting direction B2 or the return direction B1 may be called "direction B".

Figure 17:
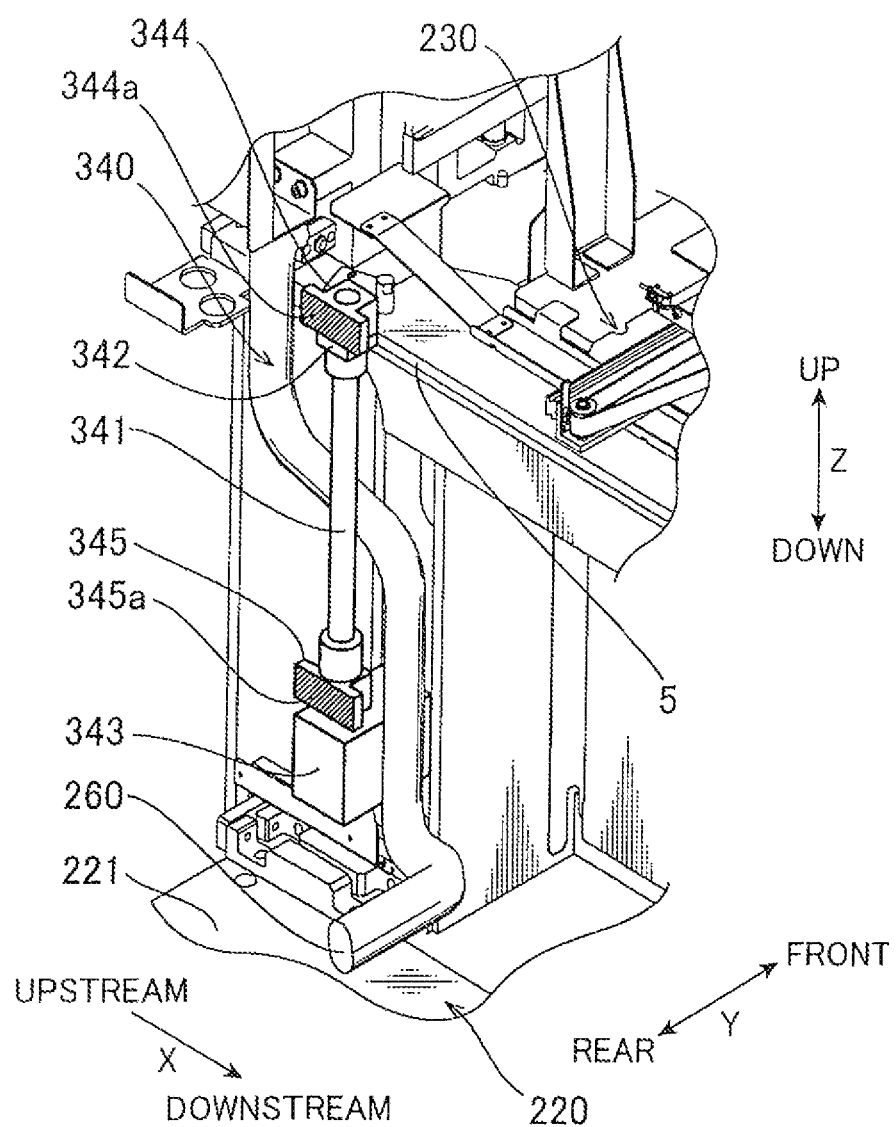
FIG. 17 is a rear side perspective diagram showing a rotation regulating section of the component supplying apparatus according to the second embodiment of the present invention.

As shown in FIG. 17, the pallet storing section 210 is configured to able to move without releasing connection with the harness 260, when moved (rotated) between the supply position P1 and the retracted position P3 (see FIG. 16). More specifically, the harness 260 is provided in a position close to the rotation regulating section 340 (in the vicinity of the rotating shaft 341), so as to connect between the surface mounting apparatus 100 and the pallet storing section 210. Therefore, when the pallet storing section 210 is rotated in direction B, it is substantially unnecessary to move the harness 260 which is provided in the vicinity of the center of rotation (rotating shaft 341). Therefore, in the second embodiment, it is possible to shorten the length of the harness 260 which is necessary in order to permit the pallet storing section 210 to move, while remaining connected to the harness 260, compared to the first embodiment described above.

As shown in FIG. 16, universal casters 256a are installed on the bottom member 215 of the pallet storing section 210, and the rolling parts thereof roll in contact with the upper surface section 221 of the base section 220, in such a manner that the pallet storing section 210 can move along the path of travel indicated by arrow B. The remainder of the composition of the second embodiment is the same as that of the first embodiment described above, and therefore repeated description thereof is omitted here.

As described previously, in the surface mounting apparatus 100 relating to the respective embodiments described above, or the component supplying apparatus 200 which is appended to the surface mounting apparatus 100, a main body side regulating section 240 and a base side regulating section 250 are provided as movement range regulating means, allowing the pallet storing section 210 to move between a supply position P1 for supplying components 10 and a retracted position P2 or a retracted position P3 to which the pallet storing section 210 is retracted in order to carry out maintenance of the surface mounting apparatus 100, and for regulating the range of relative movement of the pallet storing section 210 with respect to the surface mounting apparatus 100 to a movement amount L4 or θ previously established. Therefore, in these respective embodiments, it is possible to move the pallet storing section 210 relatively with respect to the surface mounting apparatus 100 between the supply position P1 and the retracted position P2 or the retracted position P3. By this means, it is possible readily to ensure a maintenance working space simply by moving the pallet storing section 210 of the component supplying apparatus 200 through a prescribed movement amount L4 or θ, when performing maintenance of the surface mounting apparatus 100. As a result of this, in the present embodiment, it is possible readily to ensure a working space for maintenance of the surface mounting apparatus 100, while simplifying the task of moving the component supplying apparatus 200 for maintenance.

Furthermore, in the respective embodiments, a harness 260 which connects the pallet storing section 210 with the surface mounting apparatus 100 is also provided, and the main body side regulating section 240 and the base side regulating section 250 restrict the movement amount L4 or θ, in such a manner that the pallet storing section 210 can move, while remaining the harness 260 to still be connected to the surface mounting apparatus 100. Therefore, in the respective embodiments, even when the signal cables, power supply cables, air supply hoses, and the like, are connected to the component supplying apparatus 200 via the harness 260, by setting the movement amount L4 or θ to within the range of the length of the harness 260, it is possible to ensure a maintenance work space simply by moving the pallet storing section 210 relatively with respect to the surface mounting apparatus 100, without performing a task of detaching the various cables connected to the component supplying apparatus 200. By this means, it is possible to simplify the task of moving the component supplying apparatus 200 for maintenance work. In particular, in the second embodiment, since the pallet storing section 210 is rotated about the rotating shaft 341, then it is possible to shorten as far as possible the length of the harness 260 which permits movement of the pallet storing section 210, when the harness 260 is connected to the vicinity of the rotating shaft 341.

Furthermore, in the respective embodiments, the main body side regulating section 240 and the base side regulating section 250 defines the movement direction of the pallet storing section 210 to a direction in which the distance L1 of the work space for maintenance work on the surface mounting apparatus 100 is enlarged by a distance of L2 or L5. Therefore, during maintenance work, it is possible to enlarge the maintenance work space for the surface mounting apparatus 100 readily, just by moving the pallet storing section 210 from the supply position P1 to the retracted position P2 or the retracted position P3 (or by moving the pallet storing section 210 from the supply position P1 in the retracting direction A2 or the retracting direction B2).

Moreover, in the respective embodiments, the component supplying apparatus 200 is provided with an elevator mechanism (magazine section 212, raising and lowering mechanism 213, and the like), disposed in the pallet storing section 210, for storing pallets 12 which hold components 10, and a drawer mechanism 230 for moving a pallet 12 stored in the elevator mechanism (magazine section 212, raising and lowering mechanism 213, and the like) from the pallet storing section 210 to a prescribed position on the surface mounting apparatus 100 side. The pallet storing section 210 is configured to be relatively movable with respect to the drawing mechanism 230 and the surface mounting apparatus 100 while remaining the drawer mechanism 230 on the surface mounting apparatus 100 side. Therefore, during maintenance work, it is possible to ensure a work space readily, by moving the pallet storing section 210, which is liable to be large in size due to storing pallets 12, relatively with respect to the drawer mechanism 230 and the surface mounting apparatus 100. Furthermore, since the pallet storing section 210 can be moved relatively with respect to the surface mounting apparatus 100 while the drawer mechanism 230 is situated on the surface mounting apparatus 100 side, positional registration and horizontal leveling of the drawer mechanism 230 with respect to the surface mounting apparatus 100 is not necessary during the returning task after the completion of maintenance work, and the tasks involved in maintenance of the surface mounting apparatus 100 can be simplified yet further.

Furthermore, in the respective embodiments, the main body side regulating section 240 and the base side regulating section 250 are provided with guide mechanisms which guide the pallet storing section 210 so as to move back and forth reciprocally along the same path of travel between the supply position P1 and the retracted position P2 or the retracted position P3. Therefore, it is possible to move the pallet storing section 210 to the original supply position P1 along the same path of travel as when the pallet storing section 210 is retracted to the retracted position P2 or the retracted position P3 during maintenance work (the return direction A1 or the return direction B1), by means of the main body side regulating section 240 and the base side regulating section 250. Accordingly, positional registration of the pallet storing section 210 is not necessary in the returning task after the completion of maintenance work, and the work involved in the maintenance of the surface mounting apparatus 100 can be further simplified.

Moreover, in the first embodiment, the guide mechanism is provided with linear guide rails 241a and 241b serving as guide members which are disposed on either one of the pallet storing section 210 side and the surface mounting apparatus 100 side, and sliders 242a and 242b serving as moving members which are disposed on the other of the pallet storing section 210 side and the surface mounting apparatus 100 side, the pallet storing section 210 and the surface mounting apparatus 100 being coupled so as to be movable relative to each other by means of the linear guide rails 241a and 241b and the sliders 242a and 242b. Meanwhile, in the second embodiment, the guide mechanism is provided with block bearings 342 and 343 which serve as guide members that are disposed on either one of the pallet storing section 210 side and the surface mounting apparatus 100 side, and a rotating shaft 341 which serves as a moving member, disposed on the other of the pallet storing section 210 side and the surface mounting apparatus 100 side. The pallet storing section 210 and the surface mounting apparatus 100 are so coupled to be movable relative to each other by means of the block bearings 342 and 343 and the rotating shaft 341. Therefore, in the respective embodiments, the pallet storing section 210 can move relatively while connecting to the surface mounting apparatus 100. Therefore, detachment tasks and attachment tasks between the pallet storing section 210 and the surface mounting apparatus 100 are not necessary before and after maintenance work, and the work associated with maintenance of the surface mounting apparatus 100 can be further simplified, in addition to which a positional registration task for the pallet storing section 210 is not necessary and the work associated with maintenance of the surface mounting apparatus 100 can also be further simplified.

Furthermore, in the first embodiment, the guide mechanism defines the path of travel to an oblique path as shown by arrow A in plan view with respect to the surface mounting apparatus 100. Therefore, it is possible to ensure a working space effectively, by separating the pallet storing section 210 in an oblique direction, without interfering with the surface mounting apparatus 100. If, for example, the pallet storing section 210 were moved directly backwards from the surface mounting apparatus 100, then a large space would be required to the rear of the surface mounting apparatus 100. If such a space could not be guaranteed, then it would present an obstacle to the movement of the operator. Furthermore, if the pallet storing section 210 is moved directly sideways from the surface mounting apparatus 100, there is a possibility of interference with the other mechanisms of the surface mounting apparatus 100. On the contrary to this, the pallet storing section 210 in the first embodiment can be separated in an oblique direction, and therefore it is possible to ensure a working space effectively without the pallet storing section 210 interfering with the surface mounting apparatus 100.

In the second embodiment, meanwhile, the guide mechanism includes a rotating shaft 341 as a shaft member which defines the path of travel about the vertical direction. Therefore, it is possible readily to enlarge the space for maintenance work on the surface mounting apparatus 100, simply by turning the pallet storing section 210 about the shaft member. Also, since the pallet storing section 210 can be returned to the original supply position simply by rotating the pallet storing section 210 in the opposite direction, the positional registration work for the pallet storing section 210 is not required and the work associated with maintenance of the surface mounting apparatus 100 can be simplified.

Moreover, in the respective embodiments, the main body side regulating section 240 and the base side regulating section 250 are also provided with a base section 220 as a base member which is attached to the surface mounting apparatus 100, and a flat upper surface section 221, formed on the upper part of the base section 220, for mounting thereon the pallet storing section 210. Consequently, the pallet storing section 210 can be moved over the flat upper surface section 221 of the base section 220. Therefore, if once the base section 220 has been leveled horizontally and fixed with respect to the surface mounting apparatus 100, then no further horizontal leveling is required with respect of the pallet storing section 210, even if the pallet storing section 210 is moved over the upper surface section 221. Therefore, since it is not necessary to carry out horizontal leveling work for the pallet storing section 210 each time the pallet storing section 210 is moved relatively with respect to the surface mounting apparatus 100 for maintenance work, the work involved with maintenance of the surface mounting apparatus 100 can be further simplified.

Moreover, in the respective embodiments the component supplying apparatus 200 is also provided with: a lower surface section which is formed on the pallet storing section 210 to oppose the upper surface section 221 of the base section 220, and roller members 256 or universal casters 256a, which are attached to either one of the lower surface section or the upper surface section 221, serving as moving vehicles that are capable of rolling to move in contacting with the other of the lower surface section and the upper surface section 221. Therefore, the pallet storing section 210 is able to move smoothly over the upper surface section 221 of the base section 220 by means of the roller members 256 or the universal casters 256a.

Furthermore, in the first embodiment, the main body side regulating section 240 and the base side regulating section 250 are also provided with a trapezoidal thread 251 which serves as a screw shaft and is disposed on either one of the pallet storing section 210 and the surface mounting apparatus 100, a movement nut 251a which serves as a female screw member, screwed onto the trapezoidal thread 251, and is provided on the other of the pallet storing section 210 and the surface mounting apparatus 100, and a handle 253 which serves as a drive mechanism that causes relative rotation of the trapezoidal thread 251 and the movement nut 251a. Therefore, it is possible readily to move the pallet storing section 210 accurately through a prescribed movement amount L4 in a uniform direction, by means of the trapezoidal thread 251 and the movement nut 251a. Moreover, since the pallet storing section 210 is held in a fixed fashion by the threaded engagement of the trapezoidal thread 251 and the movement nut 251a, it is possible to prevent displacement of the pallet storing section 210. Moreover, since the pallet storing section 210 is moved relatively with respect to the surface mounting apparatus 100 by relatively rotating the trapezoidal thread 251 and the movement nut 251a, it is possible to move the pallet storing section 210 readily, even if the weight of the pallet storing section 210 is large, for instance, in cases where a plurality of pallets 12 are stored in the pallet storing section 210.

In the second embodiment, meanwhile, since the rotation regulating section 340 is provided with a rotating shaft 341 which regulates, as described above, the pallet storing section 210 in a direction away from the surface mounting apparatus 100 (arrow B2), while allowing rotatably about the Z axis, it is possible to enlarge the working space for maintenance of the surface mounting apparatus 100 readily just by rotating the pallet storing section 210 in the direction of arrow B2 about the rotating shaft 341. Furthermore, since the pallet storing section 210 can be returned to the original supply position P1 just by rotating in the opposite direction (the direction of arrow B1), positional registration work for the pallet storing section 210 is not required and the work associated with maintenance of the surface mounting apparatus 100 can be further simplified. Moreover, since the pallet storing section 210 is rotated about the rotating shaft 341, it is possible to shorten the length of the harness 260 for moving the pallet storing section 210.

The embodiments disclosed here are examples in all respects and should not be considered as limiting the present invention. The scope of the present invention is indicated by the claims and not by the description of the embodiments given above, and furthermore, the present invention includes all modifications within equivalent range and meaning to that of the claims.

For example, in the first embodiment and the second embodiment described above, the component supplying apparatus of the present invention is applied to a component supply unit of a surface mounting apparatus, but the present invention is not limited to this. For instance, the present invention can also be applied to a component supplying apparatus which is used in a component inspection apparatus, such as an IC handler.

Moreover, in the first embodiment described above, an example is given in which the movement direction of the pallet storing section 210 is regulated to the A direction (an oblique backward direction with respect to the surface mounting apparatus 100) by the linear guide rails 241a and 241b. The present invention is, however, not limited to this. In the present invention, the pallet storing section may be regulated so as to be movable only in the left/right direction (the direction following the conveyance direction X). Moreover, the pallet storing section may also be regulated so as to move leftwards and rightwards in the conveyance direction X after first being moved directly backwards. Furthermore, if space can be guaranteed, it is also possible to move the pallet storing section directly backwards only, or to adopt a composition where the pallet storing section is moved in an oblique direction other than 18 degrees.

Moreover, in the first embodiment described above, an example is given in which the pair of linear guide rails 241a and 241b are arranged in the conveyance direction X, but the present invention is not limited to this. In the present invention, the pallet storing section may be regulated by one linear guide rail, or three or more linear guide rails may be provided.

Furthermore, in the first embodiment described above, an example is given in which the pallet storing section 210 is regulated so as to be movable in the range of the movement amount L4 and in the second embodiment described above, an example is given in which the pallet storing section 210 is regulated so as to be movable in the range of the amount of rotation $\theta$, but the present invention is not limited to this. In the present invention, it is also possible to adopt a composition in which the range of movement of the pallet storing section is smaller than L4, or larger than L4, or a composition in which the range of rotation of the pallet storing section is smaller than $\theta$ or larger than $\theta$.

Furthermore, in the first embodiment and the second embodiment described above, an example is given in which the pallet storing section 210 is moved relatively with respect to the surface mounting apparatus 100 and the drawer mechanism 230 while the drawer mechanism 230 is situated on the surface mounting apparatus 100 side (on the base 5), but the present invention is not limited to this. In the present invention, the drawer mechanism can also be configured to move in unison with the pallet storing section.

Furthermore, in the first embodiment described above, an example is given in which the pallet storing section 210 is regulated so as to be movable along a linear path of travel in direction A, and in the second embodiment described above, an example is given in which the pallet storing section 210 is regulated so as to be rotatable along a circular arc-shaped path of travel in direction B, but the present invention is not limited to this. For example, it is possible to regulate the pallet storing section so as to be movable along a path of travel other than a circular arc, and to regulate the pallet storing section so as to be movable freely within a range on the base section.

Furthermore, in the first embodiment and the second embodiment described above, an example is described in which the pallet storing section 210 is regulated so as to be movable (rotatable) in the horizontal direction, but the present invention is not limited to this. For example, it is also possible to adopt a composition in which the pallet storing section is moved obliquely upwards or obliquely downwards towards a retracted position.

Furthermore, in the first embodiment and the second embodiment described above, an example is described in which the pallet storing section 210 is moved on the base section 220, but the present invention is not limited to this. For example, it is also possible to dispose the pallet storing section directly on the surface of the ground (floor), in a movable fashion.

Furthermore, in the first embodiment described above, an example was given in which roller members 256 having casters are provided on the bottom member 215 of the pallet storing section 210, but the present invention is not limited to this. In the present invention, it is also possible to adopt a composition in which the pallet storing section is movable without providing roller members thereon.

Moreover, in the first embodiment described above, an example is described in which a base side regulating section 250 is provided between the pallet storing section 210 and the base section 220, but the present invention is not limited to this. In the present invention, it is also possible to regulate the range of movement of the pallet storing section by means of a main body side regulating section only, without providing a base side regulating section.

Furthermore, in the first embodiment described above, an example is described in which the pallet storing section 210 is configured to be moved by means of the trapezoidal thread 251 on the base side regulating section 250 and the movement nut 251a, but the present invention is not limited to this. In the present invention, it is also possible for the operator to move the pallet storing section by pushing the pallet storing section directly, without providing a trapezoidal thread and a movement nut, and it is also possible to move the pallet storing section by using an air cylinder, or the like. Moreover, the pallet storing section can also be rotated by using a servo motor, or the like, rather than a handle 253 to turn the trapezoidal thread.

Furthermore, it is also possible to make the nut rotatable, and to make the bolt fixed.

Furthermore, in the first embodiment described above, an example is described in which the sliders 242a and 242b of the main body side regulating section 240 are installed on the pallet storing section 210 side, and linear guide rails 241a and 241b are provided on the surface mounting apparatus 100 side (base 5), but the present invention is not limited to this. In the present invention, it is also possible to adopt a composition in which the sliders are fixed to the surface mounting apparatus 100 side (base 5), and linear guide rails are provided on the pallet storing section 210 side, in such a manner that the linear guide rails move with respect to the sliders in accordance with the movement of the pallet accommodating section.

Furthermore, in the first embodiment described above, an example was given in which a movement nut 251a is provided on the bottom member 215 of the pallet storing section 210, and a trapezoidal thread 251 is provided on the base section 220, but the present invention is not limited to this. In the present invention, it is also possible to provide a trapezoidal thread on the bottom member of the pallet storing section, while providing a movement nut on the base member.

As described above, the component supplying apparatus according to a first aspect of the invention is appended to an electronic component working apparatus for operating prescribed work using electronic components, for supplying electronic components to the electronic component working apparatus, comprising: a component storing section adapted to store the electronic components; and movement range regulating means, adapted to allow the component storing section to move between a supply position for supplying the electronic components and a retracted position to which the component storing section retracts for the purpose of maintenance of the electronic component working apparatus, for regulating a range of relative movement of the component storing section with respect to the electronic component working apparatus to a movement amount that is previously established.

In the component supplying apparatus according to this first aspect, by providing the movement range regulating means as described above, it is possible to move the component storing section relatively with respect to the electronic component working apparatus, between a supply position and a retracted position. By this means, it is possible readily to ensure a maintenance working space simply by moving the component storing section of the component supplying apparatus through a prescribed movement amount, when performing maintenance of the electronic component working apparatus. As a result of this, in the first aspect of the present invention, it is possible readily to ensure a working space for maintenance of the electronic component working apparatus, while simplifying the task of moving the component supplying apparatus for maintenance.

Preferably, the component supplying apparatus further comprising a harness connecting the component storing section with the electronic component working apparatus, wherein the movement range regulating means is adapted to regulate the movement amount so as to enable the component storing section to move, while remaining the harness to be connected to the electronic component working apparatus. According to this aspect of the present invention, by setting the movement amount within the range of the length of the harness which connects the signal cables, power supply cables and air hoses, it is possible to ensure a maintenance work space simply by moving the component storing section relatively with respect to the electronic component working apparatus, without performing a task of detaching the various cables connected to the component supplying apparatus, even when the signal cables, power supply cables, air supply hoses, and the like, are connected to the component supplying apparatus via the harness. By this means, it is possible to simplify the task of moving the component supplying apparatus for maintenance work.

Preferably, the movement range regulating means defines a movement direction of the component storing section to a direction for enlarging a work space for maintenance work in relation to the electronic component working apparatus. By adopting a composition of this kind, it is possible to enlarge the maintenance work space in relation to an electronic component working apparatus readily, simply by moving the component storing section from a supply position to a retracted position when performing maintenance work.

Preferably, the component supplying apparatus further comprises: an elevator mechanism, provided in the component storing section, for storing a pallet holding the electronic components; and a drawer mechanism adapted to move the pallet stored in the elevator mechanism from the component storing section to a prescribed position on an electronic component working apparatus side, wherein the component storing section is configured to be movable relatively with respect to the drawer mechanism and the electronic component working apparatus, while remaining the drawer mechanism on the electronic component working apparatus side. By adopting a composition of this kind, it is possible to ensure the work space readily during maintenance work, by moving the component storing section which is liable to be large in size due to storing pallets, relatively with respect to the drawer mechanism and the surface mounting apparatus. Furthermore, since the component storing section can be moved relatively with respect to the electronic component working apparatus while remaining the drawer mechanism on the electronic component working apparatus side, positional registration and horizontal leveling of the drawer mechanism with respect to the electronic component working apparatus is not necessary during the returning task after the completion of maintenance work, and the tasks involved in maintenance of the electronic component working apparatus can be simplified yet further.

Preferably, the movement range regulating means comprises a guide mechanism adapted to guide the component storing section so as to move reciprocally along same path of travel between the supply position and the retracted position. By adopting a composition of this kind, it is possible to cause the component supply section to move to the original supply position along the same path of travel as when the component storing section retracts during maintenance work, by the movement range regulating means. Accordingly, positional registration of the component storing section is not necessary in the returning task after the completion of maintenance work, and the work involved in the maintenance of the electronic component working apparatus can be further simplified.

In this case, preferably, the guide mechanism comprises a guide member provided on either one of a component storing section side and an electronic component working apparatus side, and a moving member provided on the other of the component storing section side and the electronic component working apparatus side, and the component storing section and the electronic component working apparatus are coupled so as to be movable relative to each other by means of the guide member and the moving member. By adopting this composition, the component storing section is able to move relatively while remaining coupled to the electronic component working apparatus. Therefore, detachment tasks and attachment tasks between the component storing section and the electronic component working apparatus are not necessary before and after maintenance work, and the work associated with maintenance of the electronic component working apparatus can be further simplified, in addition to which a positional registration task for the component storing section is not necessary and the work associated with maintenance of the electronic component working apparatus can also be further simplified.

Preferably, the guide mechanism defines the path of travel to an oblique path in plan view with respect to the electronic component working apparatus. By adopting a composition of this kind, it is possible to ensure a working space effectively, by separating the component storing section in an oblique direction, without interfering with the electronic component working apparatus. In other words, if the component storing section were moved directly backwards from the electronic component working apparatus, for instance, then a large space would be required to the rear of the electronic component working apparatus, and since this space cannot be guaranteed, then this presents an obstacle to the movement of the operator. Furthermore, if the component storing section is moved directly sideways from the electronic component working apparatus, there is a possibility of interference with the other mechanisms of the electronic component working apparatus. On the other hand, if the component storing section is separated in an oblique direction as in the present aspect of the present invention, it is possible to ensure the working space effectively, without the component storing section interfering with the electronic component working apparatus.

Preferably, the guide mechanism includes a shaft member which defines the path of travel about an axis in a vertical direction. By adopting a composition of this kind, it is possible readily to enlarge the space for maintenance work on the electronic component working apparatus, simply by turning the component storing section about the shaft member. Also, since the component storing section can be returned to the original supply position simply by rotating the component storing section in the opposite direction, positional registration work for the component storing section is not required and the work associated with maintenance of the electronic component working apparatus can be simplified. Furthermore, since the component storing section is rotated about a shaft member, it is possible, in case where the signal cables, the power supply cables and the air supply hoses, and the like, are connected to a position close to the shaft member, to shorten the length of the cables for permitting movement of the component storing section.

Preferably, the movement range regulating means further comprises: a base member attached to the electronic component working apparatus; and a flat upper surface section, formed on an upper part of the base member, for mounting thereon the component storing section. By adopting a composition of this kind, it is possible to move the component storing section on the flat upper surface section of the base member. Therefore, if once the base member has been leveled horizontally and fixed with respect to the electronic component working apparatus, then no further horizontal leveling is required with respect to the component storing section, even if the component storing section has been moved over the surface section. Therefore, since it is not necessary to carry out horizontal leveling work for the component storing section each time the component storing section is moved relatively with respect to the electronic component working apparatus for maintenance work, the work involved with maintenance of the electronic component working apparatus can be further simplified.

In this case, preferably, the component supplying apparatus is further comprising: a lower surface section, formed in the component storing section to oppose the upper surface section of the base member; and a moving vehicle, installed on either one of the lower surface section and the upper surface section, for rolling to move in contacting with the other of the lower surface section and the upper surface section. By means of this composition, it is possible to cause the component storing section to move smoothly over the upper surface section of the base member by means of the moving vehicle.

Preferably, the movement range regulating means is further comprising: a screw shaft provided on either one of the component storing section and the electronic component working apparatus; a female screw member, screwed onto the screw shaft, provided on the other of the component storing section and the electronic component working apparatus; and a drive mechanism for relative rotation of the screw shaft and the female screw member. According to a composition of this kind, it is possible readily to move the component storing section accurately by a prescribed movement amount in a prescribed direction, by means of the screw shaft and the female screw member, and furthermore, the component storing section is held in a fixed fashion due to the female screw member screwed with the screw shaft, thus making it possible to prevent deviation of the position of the component storing section. Furthermore, since the component storing section is moved relatively with respect to the electronic component working apparatus by rotating the screw shaft and the female screw member, then it is possible to move the component storing section readily, even if the component storing section has a large weight, for instance, when a plurality of pallets are stored in the component storing section.

The surface mounting apparatus according to a second aspect of the present invention comprises: a head unit for holding electronic components and for mounting each of the electronic components at a prescribed position on a substrate; and a component supplying apparatus for supplying the electronic components to the head unit, wherein the component supplying apparatus includes: a component storing section for storing the electronic components; and movement range regulating means, adapted to allow the component storing section to move between a supply position for supplying the electronic components and a retracted position to which the component storing section retracts for the purpose of maintenance of the electronic component working apparatus, for regulating a range of relative movement of the component storing section with respect to the electronic component working apparatus to a movement amount that is previously established.

In the surface mounting apparatus according to this second aspect, by providing a component supplying apparatus which includes the movement range regulating means as described above, it is possible to move the component storing section relatively with respect to the surface mounting apparatus, between a supply position and a retracted position. By this means, it is possible readily to ensure a maintenance working space simply by moving the component storing section through a prescribed movement amount, when performing maintenance of the surface mounting apparatus.

The embodiments described above merely give desirable concrete examples of the present invention and the present invention is not limited to the embodiments described above. Needless to say, various modifications are possible within the scope of the claims of the present invention.

The invention claimed is:

1. A component supplying apparatus, appended to an electronic component working apparatus for operating prescribed work using electronic components, the component supplying apparatus supplying the electronic components to the electronic component working apparatus, said component supplying apparatus comprising:
   a component storing section storing the electronic components; and
   a movement range regulating mechanism that allows the component storing section to move between a supply position where the component storing section supplies the electronic components and a retracted position where the component storing section forms a space with the electronic component working apparatus, and
   the movement range regulating mechanism regulating a range of relative movement of the component storing section with respect to the electronic component working apparatus to a movement amount that is previously established.

2. The component supplying apparatus according to claim 1, further comprising a harness connecting the component storing section with the electronic component working apparatus,
   wherein the movement range regulating mechanism regulates the movement amount so as to enable the component storing section to move, while remaining the harness to be connected to the electronic component working apparatus.

3. The component supplying apparatus according to claim 1, wherein the movement range regulating mechanism defines a movement direction of the component storing section to a direction for enlarging a work space for maintenance work in relation to the electronic component working apparatus.

4. The component supplying apparatus according to claim 1, further comprising:
an elevator mechanism, provided in the component storing section, for storing a pallet holding the electronic components; and
a drawer mechanism moves the pallet stored in the elevator mechanism from the component storing section to a prescribed position on an electronic component working apparatus side,
wherein the component storing section is configured to be movable relatively with respect to the drawer mechanism and the electronic component working apparatus, while remaining the drawer mechanism on the electronic component working apparatus side.

5. The component supplying apparatus according to claim 1, wherein the movement range regulating mechanism comprises a guide mechanism which guides the component storing section so as to move reciprocally along same path of travel between the supply position and the retracted position.

6. The component supplying apparatus according to claim 5,
wherein the guide mechanism comprises a guide member provided on either one of a component storing section side and an electronic component working apparatus side, and a moving member provided on the other of the component storing section side and the electronic component working apparatus side, and
the component storing section and the electronic component working apparatus are coupled so as to be movable relative to each other by mechanism of the guide member and the moving member.

7. The component supplying apparatus according to claim 5, wherein the guide mechanism defines a travel path of the component storing section that is along a line obliquely across the electronic component working apparatus in a plan view.

8. The component supplying apparatus according to claim 5, wherein the guide mechanism includes a shaft member which defines the path of travel about an axis in a vertical direction.

9. The component supplying apparatus according to claim 1,
wherein the movement range regulating mechanism is further comprising:
a base member attached to the electronic component working apparatus; and
a flat upper surface section, formed on an upper part of the base member, for mounting thereon the component storing section.

10. The component supplying apparatus according to claim 9, further comprising:
a lower surface section, formed in the component storing section to oppose the upper surface section of the base member; and
a moving vehicle, installed on either one of the lower surface section and the upper surface section, for rolling to move in contacting with the other of the lower surface section and the upper surface section.

11. The component supplying apparatus according to claim 1,
wherein the movement range regulating mechanism is further comprising:
a screw shaft provided on either one of the component storing section and the electronic component working apparatus;
a female screw member, screwed onto the screw shaft, provided on the other of the component storing section and the electronic component working apparatus; and
a drive mechanism for relative rotation of the screw shaft and the female screw member.

12. The component supplying apparatus according to claim 1, wherein the movement range regulating mechanism comprises a guide mechanism which guides the component storing section so as to move reciprocally between the supply position and the retracted position along a direction which obliquely intersects the electronic component working apparatus in a plan view.

* * * * *